(12) United States Patent
Shen et al.

(10) Patent No.: US 12,062,692 B2
(45) Date of Patent: Aug. 13, 2024

(54) TAPERED DIELECTRIC LAYER FOR PREVENTING ELECTRICAL SHORTING BETWEEN GATE AND BACK SIDE VIA

(71) Applicant: Taiwan Semiconductor Manufacturing Company, Ltd., Hsinchu (TW)

(72) Inventors: Shu-Wen Shen, Hsinchu (TW); Wei-Yang Lee, Taipei (TW); Yen-Po Lin, Taipei (TW); Jiun-Ming Kuo, Taipei (TW); Kuo-Yi Chao, Hsinchu (TW); Yuan-Ching Peng, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 157 days.

(21) Appl. No.: 17/459,342

(22) Filed: Aug. 27, 2021

(65) Prior Publication Data
US 2023/0067804 A1 Mar. 2, 2023

(51) Int. Cl.
*H01L 29/06* (2006.01)
*H01L 21/768* (2006.01)
(Continued)

(52) U.S. Cl.
CPC .... *H01L 29/0665* (2013.01); *H01L 21/76831* (2013.01); *H01L 21/76877* (2013.01);
(Continued)

(58) Field of Classification Search
CPC ....... H01L 21/823431; H01L 21/76831; H01L 21/76877; H01L 21/823481; H01L 29/0665; H01L 29/42392; H01L 29/66795; H01L 29/785; H01L 29/66545; H01L 27/0886; H01L 23/481
See application file for complete search history.

(56) References Cited

U.S. PATENT DOCUMENTS 7,667,271 B2  2/2010  Yu et al.
7,910,453 B2  3/2011  Xu et al.
(Continued)

FOREIGN PATENT DOCUMENTS

CN  113299646 A  8/2021

*Primary Examiner* — Jaehwan Oh
*Assistant Examiner* — John M Parker
(74) *Attorney, Agent, or Firm* — HAYNES AND BOONE, LLP

(57) ABSTRACT

A plurality of first semiconductor layers and second semiconductor layers are formed over a front side of a substrate. The first semiconductor layers interleave with the second semiconductor layers in a vertical direction. The first semiconductor layers and second semiconductor layers are etched into a plurality of stacks. The etching is performed such that a bottommost first semiconductor layer is etched to have a tapered profile in a cross-sectional view. The bottommost first semiconductor layer is replaced with a dielectric layer. The dielectric layer inherits the tapered profile of the bottommost first semiconductor layer. Gate structures are formed over the stacks. The gate structures each extend in a first horizontal direction. A first interconnect structure is formed over the gate structures. A second interconnect structure is formed over a back side of the substrate.

20 Claims, 17 Drawing Sheets

(51) Int. Cl.
 *H01L 23/48* (2006.01)
 *H01L 29/423* (2006.01)
(52) U.S. Cl.
 CPC ...... *H01L 21/76898* (2013.01); *H01L 23/481* (2013.01); *H01L 29/42392* (2013.01)

(56) References Cited

U.S. PATENT DOCUMENTS

| | | | |
|---|---|---|---|
| 8,377,779 B1 | 2/2013 | Wang | |
| 8,399,931 B2 | 3/2013 | Liaw et al. | |
| 8,487,378 B2 | 7/2013 | Goto et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,729,634 B2 | 5/2014 | Shen et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,826,213 B1 | 9/2014 | Ho et al. | |
| 8,860,148 B2 | 10/2014 | Hu et al. | |
| 8,887,106 B2 | 11/2014 | Ho et al. | |
| 11,444,170 B1* | 9/2022 | Chou | H01L 29/0673 |
| 11,532,720 B2* | 12/2022 | Chung | H01L 29/42392 |
| 2014/0001574 A1 | 1/2014 | Chen et al. | |
| 2014/0110755 A1 | 4/2014 | Colinge | |
| 2014/0151812 A1 | 6/2014 | Liaw | |
| 2014/0282326 A1 | 9/2014 | Chen et al. | |
| 2017/0154973 A1 | 6/2017 | Ching | |
| 2019/0148376 A1* | 5/2019 | Chanemougame | H01L 27/0688 257/532 |
| 2020/0044023 A1* | 2/2020 | Reznicek | H01L 23/5329 |
| 2020/0303502 A1 | 9/2020 | Bomberger | |
| 2021/0305381 A1* | 9/2021 | Chiang | H01L 29/78696 |
| 2022/0028786 A1* | 1/2022 | Huang | H01L 29/78696 |
| 2022/0139911 A1* | 5/2022 | Wei | H01L 27/0886 257/365 |
| 2023/0238284 A1* | 7/2023 | Huang | H01L 21/823475 257/401 |

* cited by examiner

TAPERED DIELECTRIC LAYER FOR PREVENTING ELECTRICAL SHORTING BETWEEN GATE AND BACK SIDE VIA

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, integrated circuits (IC) have include both transistors and interconnect structures (vias and wires) that provide electrical connectivity to the transistors. As the integrated circuits continue to scale down, the smaller IC component sizes may lead to unintentional electrical shorting, for example between conductive vias and metal gate structures of the transistors. If electrical shorting occurs, it may degrade device performance and/or lead to device failures.

Therefore, although existing approaches in semiconductor fabrication have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1B:
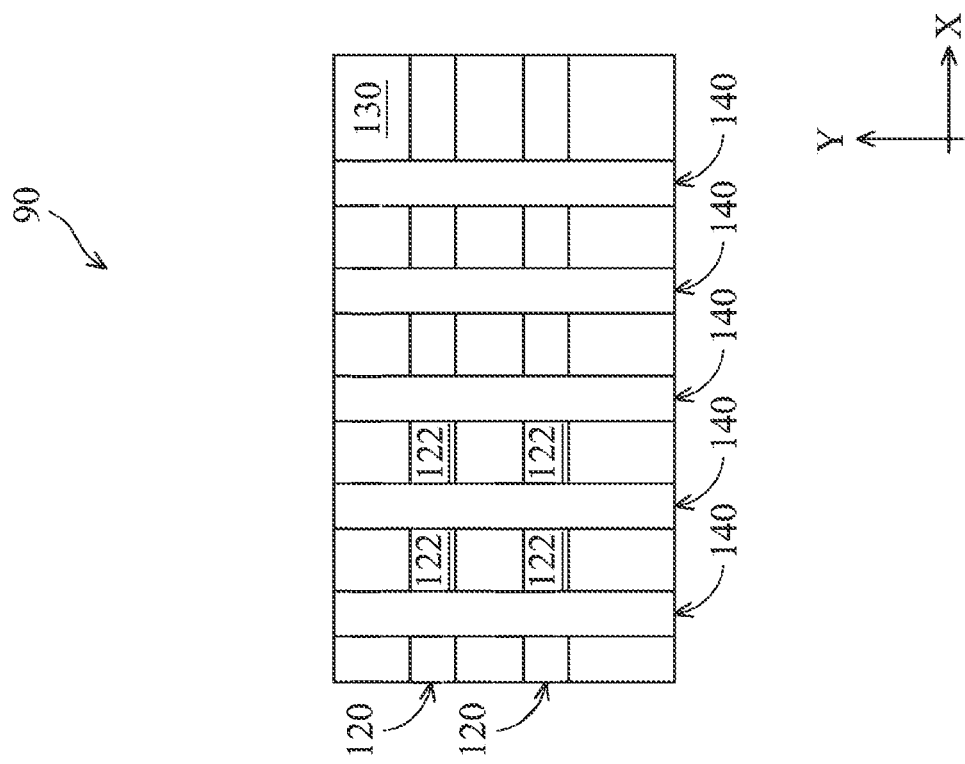
FIG. 1A is a perspective view of an IC device and FIG. 1B is a planar top view of the IC device in the form of a FinFET according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices, and more particularly to field-effect transistors (FETs), such as three-dimensional fin-line FETs (FinFETs) or gate-all-around (GAA) devices. One aspect of the present disclosure involves forming a tapered dielectric layer to electrically isolate the gate structures and source/drain vias formed from a back side. As a result, device yield, reliability, and/or performance may be improved, as discussed below in more detail.

Figure 1A:
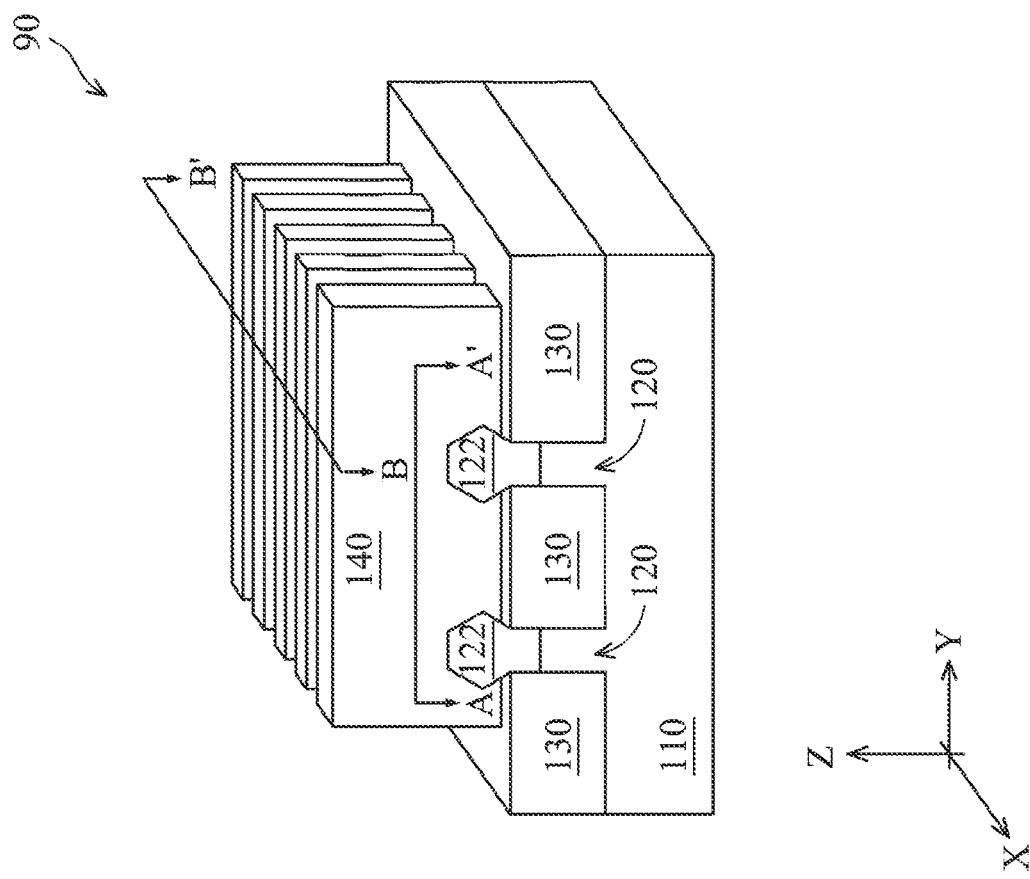

FIGS. 1A and 1B illustrate a three-dimensional perspective view and a top view, respectively, of a portion of an Integrated Circuit (IC) device 90. The IC device 90 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations, unless otherwise claimed. For example, although the IC device 90 as illustrated is a three-dimensional FinFET device, the concepts of the present disclosure may also apply to planar FET devices or GAA devices.

Referring to FIG. 1A, the IC device 90 includes a substrate 110. The substrate 110 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 110 may be a single-layer material having a uniform composition. Alternatively, the substrate 110 may include multiple material layers having similar or different compositions suitable for IC device manufacturing. In one example, the substrate 110 may be a silicon-on-insulator (SOI) substrate having a semiconductor silicon layer formed on a silicon oxide layer. In another example, the substrate 110 may include a conductive layer, a semiconductor layer, a dielectric layer, other layers, or combinations thereof. Various doped regions, such as source/drain regions, may be formed in or on the substrate 110. The doped regions may be doped with n-type dopants, such as phosphorus or arsenic, and/or p-type dopants, such as boron, depending on design requirements. The doped regions may be formed directly on the substrate 110, in a p-well structure, in an n-well structure, in a dual-well structure, or using a raised structure. Doped regions may be formed by implantation of dopant atoms, in-situ doped epitaxial growth, and/or other suitable techniques.

Three-dimensional active regions 120 are formed on the substrate 110. The active regions 120 are elongated fin-like structures that protrude upwardly out of the substrate 110. As such, the active regions 120 may be interchangeably referred to as fin structures 120 or fin structures 120 hereinafter. The fin structures 120 may be fabricated using suitable processes including photolithography and etch processes. The photolithography process may include forming a photoresist layer overlying the substrate 110, exposing the photoresist to a pattern, performing post-exposure bake processes, and developing the photoresist to form a masking element (not shown) including the resist. The masking element is then used for etching recesses into the substrate 110, leaving the fin structures 120 on the substrate 110. The etching process may include dry etching, wet etching, reactive ion etching (RIE), and/or other suitable processes. In some embodiments, the fin structure 120 may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. As an example, a layer may be formed over a substrate and patterned using a photolithography process. Spacers are formed alongside the patterned layer using a self-aligned process. The layer is then removed, and the remaining spacers, or mandrels, may then be used to pattern the fin structures 120.

The IC device 90 also includes source/drain features 122 formed over the fin structures 120. The source/drain features 122 may include epi-layers that are epitaxially grown on the fin structures 120. As device sizes continue to shrink, these source/drain features 122 may merge into one another even when they are meant to be kept separate. This is the problem that the present disclosure overcomes, as discussed below in more detail.

The IC device 90 further includes isolation structures 130 formed over the substrate 110. The isolation structures 130 electrically separate various components of the IC device 90. The isolation structures 130 may include silicon oxide, silicon nitride, silicon oxynitride, fluoride-doped silicate glass (FSG), a low-k dielectric material, and/or other suitable materials. In some embodiments, the isolation structures 130 may include shallow trench isolation (STI) features. In one embodiment, the isolation structures 130 are formed by etching trenches in the substrate 110 during the formation of the fin structures 120. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 130. Alternatively, the isolation structures 130 may include a multi-layer structure, for example, having one or more thermal oxide liner layers.

The IC device 90 also includes gate structures 140 formed over and engaging the fin structures 120 on three sides in a channel region of each fin 120. The gate structures 140 may be dummy gate structures (e.g., containing an oxide gate dielectric and a polysilicon gate electrode), or they may be HKMG structures that contain a high-k gate dielectric and a metal gate electrode, where the HKMG structures are formed by replacing the dummy gate structures. Though not depicted herein, the gate structure 140 may include additional material layers, such as an interfacial layer over the fin structures 120, a capping layer, other suitable layers, or combinations thereof.

Referring to FIG. 1B, multiple fin structures 120 are oriented lengthwise along the X-direction, and multiple gate structure 140 are oriented lengthwise along the Y-direction, i.e., generally perpendicular to the fin structures 120. In many embodiments, the IC device 90 includes additional features such as gate spacers disposed along sidewalls of the gate structures 140, hard mask layer(s) disposed over the gate structures 140, and numerous other features.

Figure 1C:
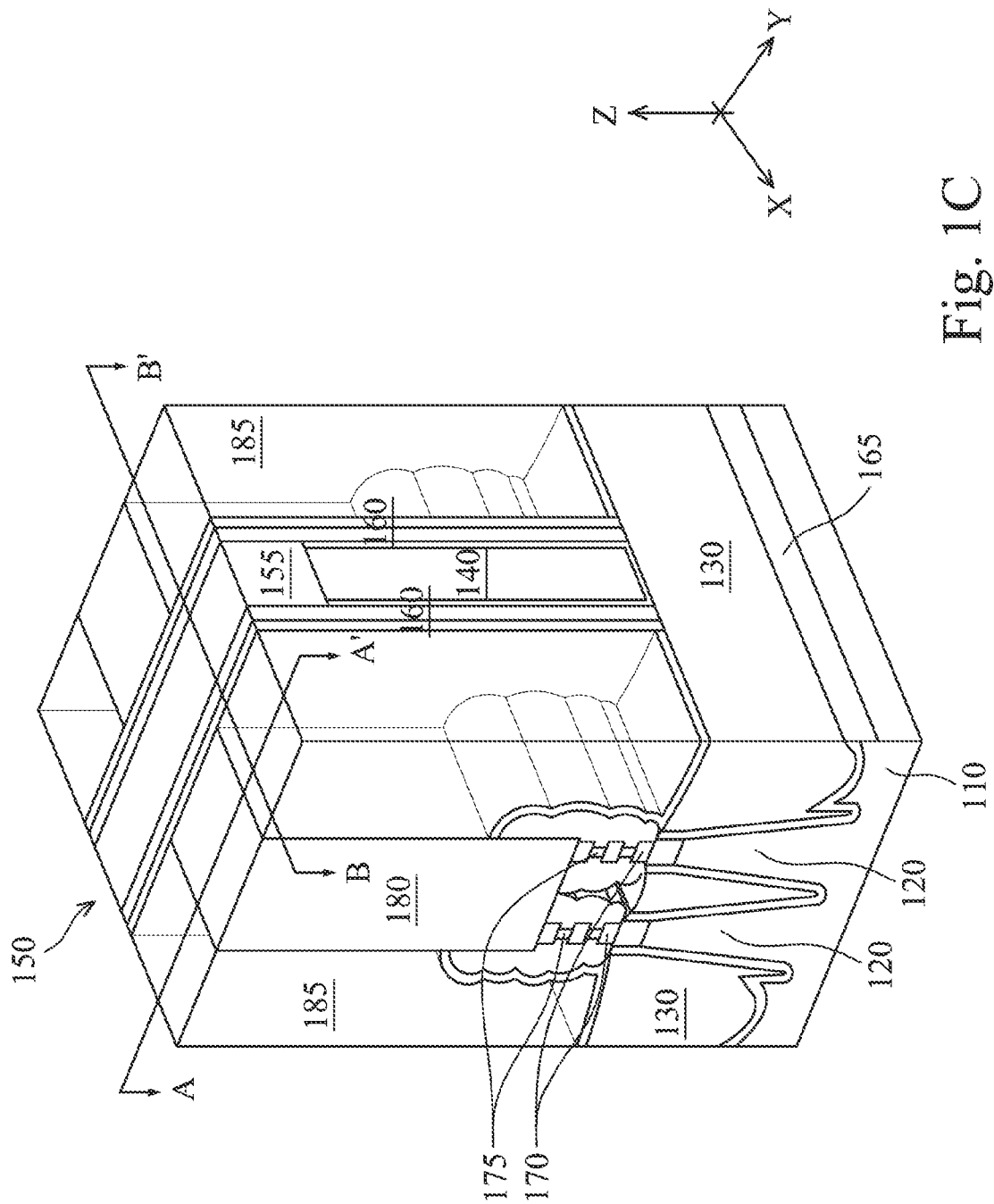
FIG. 1C is a perspective view of an IC device in the form of a GAA device according to various aspects of the present disclosure.

It is also understood that the various aspects of the present disclosure discussed below may apply to multi-channel devices such as Gate-All-Around (GAA) devices. FIG. 1C illustrates a three-dimensional perspective view of an example GAA device 150. For reasons of consistency and clarity, similar components in FIG. 1C and FIGS. 1A-1B will be labeled the same. For example, active regions such as fin structures 120 rise vertically upwards out of the substrate 110 in the Z-direction. The isolation structures 130 provide electrical separation between the fin structures 120. The gate structure 140 is located over the fin structures 120 and over the isolation structures 130. A mask 155 is located over the gate structure 140, and gate spacers 160 are located on sidewalls of the gate structure 140. A capping layer 165 is formed over the fin structures 120 to protect the fin structures 120 from oxidation during the forming of the isolation structures 130.

A plurality of nano-structures 170 are disposed over each of the fin structures 120. The nano-structures 170 may include nano-sheets, nano-tubes, or nano-wires, or some other type of nano-structure that extends horizontally in the X-direction. Portions of the nano-structures 170 under the gate structure 140 may serve as the channels of the GAA device 150. Dielectric inner spacers 175 may be disposed between the nano-structures 170. In addition, although not illustrated for reasons of simplicity, each of the nano-structures 170 may be wrapped around circumferentially by a gate dielectric as well as a gate electrode. In the illustrated embodiment, the portions of the nano-structures 170 outside the gate structure 140 may serve as the source/drain features of the GAA device 150. However, in some embodiments, continuous source/drain features may be epitaxially grown over portions of the fin structures 120 outside of the gate structure 140. Regardless, conductive source/drain contacts 180 may be formed over the source/drain features to provide electrical connectivity thereto. An interlayer dielectric (ILD) 185 is formed over the isolation structures 130 and around the gate structure 140 and the source/drain contacts 180.

Additional details pertaining to the fabrication of GAA devices are disclosed in U.S. Pat. No. 10,164,012, titled "Semiconductor Device and Manufacturing Method Thereof" and issued on Dec. 25, 2018, as well as in U.S. Pat. No. 10,361,278, titled "Method of Manufacturing a Semiconductor Device and a Semiconductor Device" and issued on Jul. 23, 2019, and also in U.S. Pat. No. 9,887,269, titled "Multi-Gate Device and Method of Fabrication Thereof" and issued on Feb. 6, 2018, the disclosures of each which are hereby incorporated by reference in their respective entireties. To the extent that the present disclosure refers to a fin structure or FinFET devices, such discussions may apply equally to the GAA devices.

Figure 2:
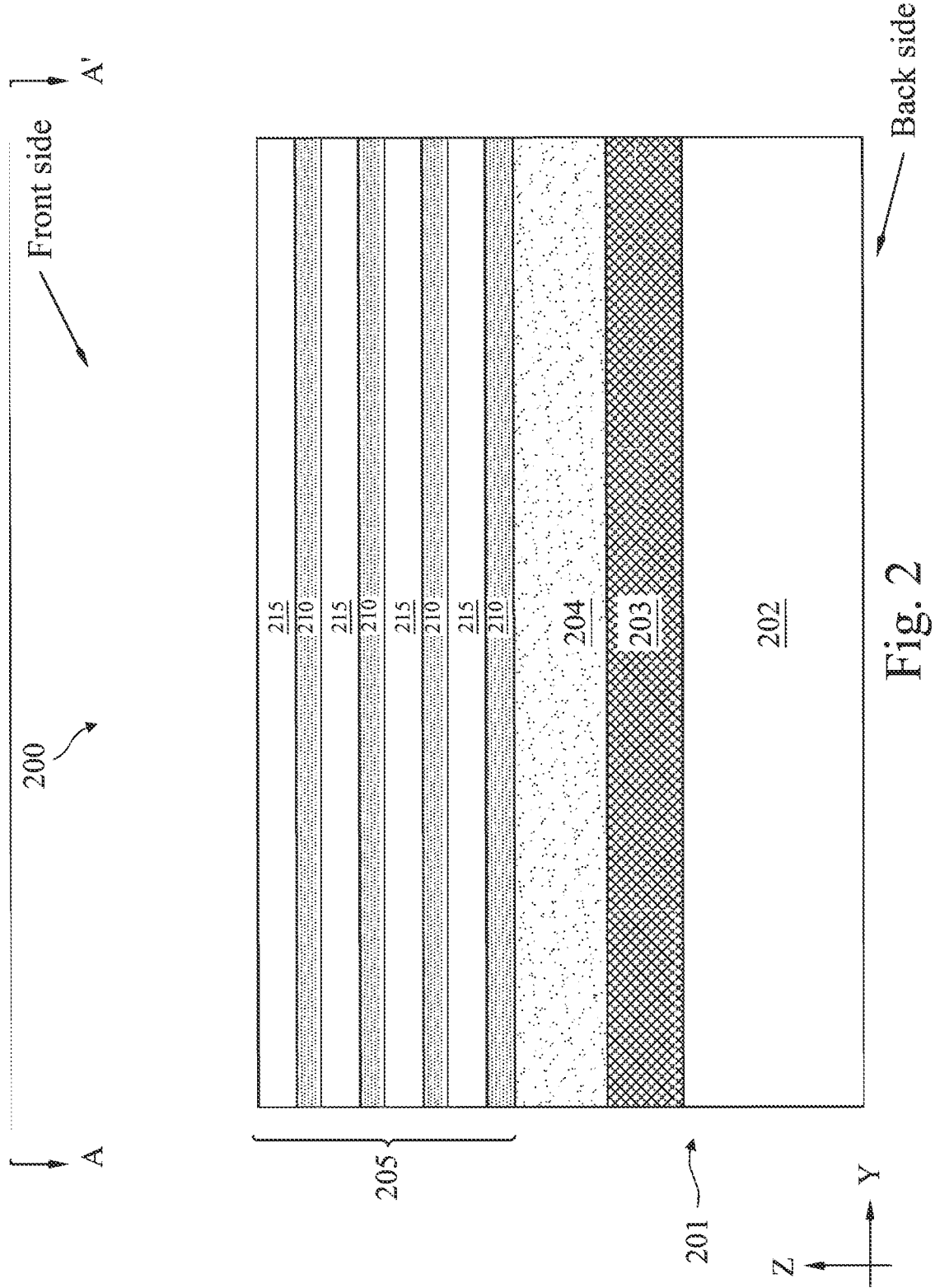
FIGS. 2-4 are cross-sectional side views of an embodiment of an IC device at various stages of fabrication according to various aspects of the present disclosure.
Figure 3:
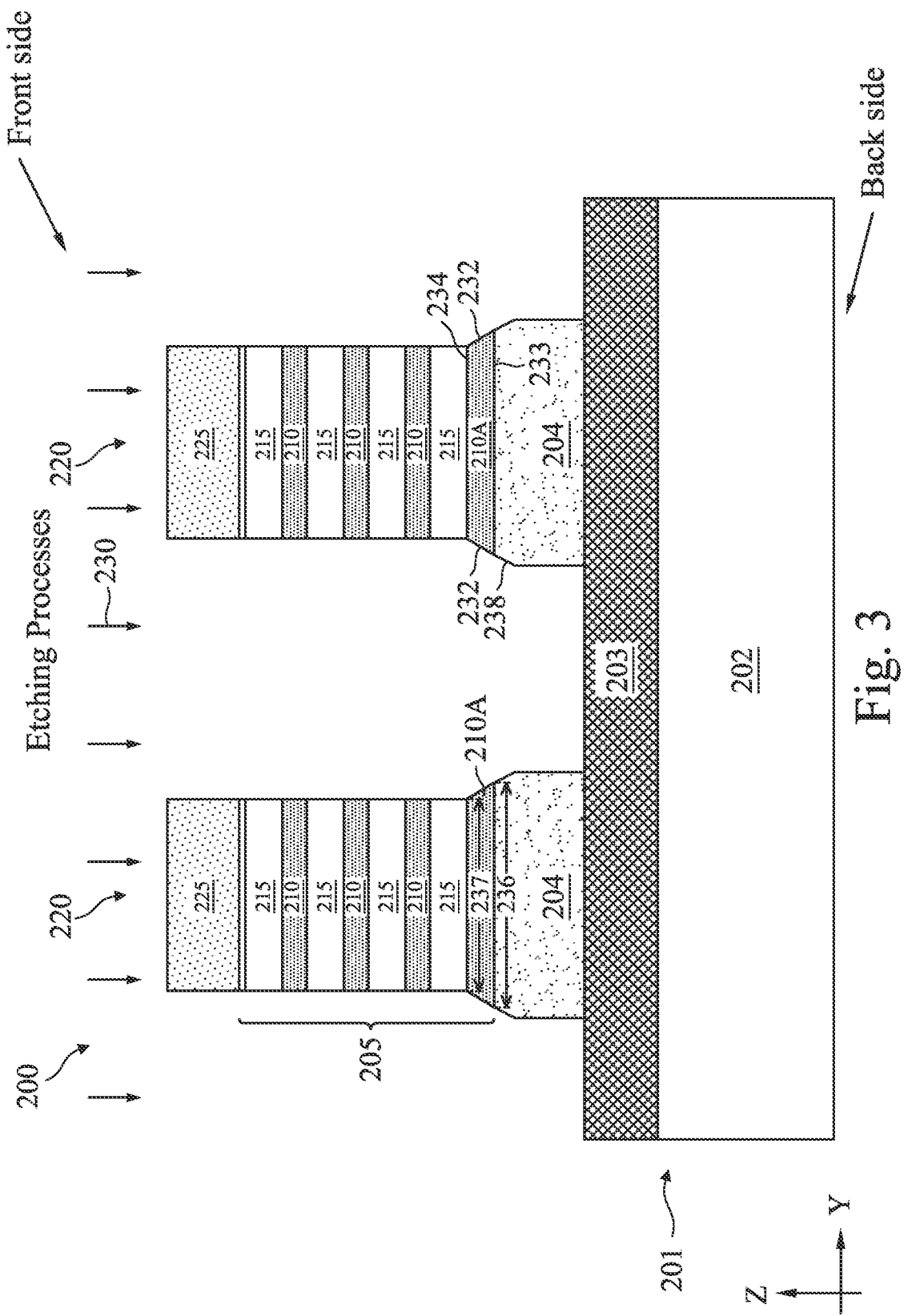
Figure 4:
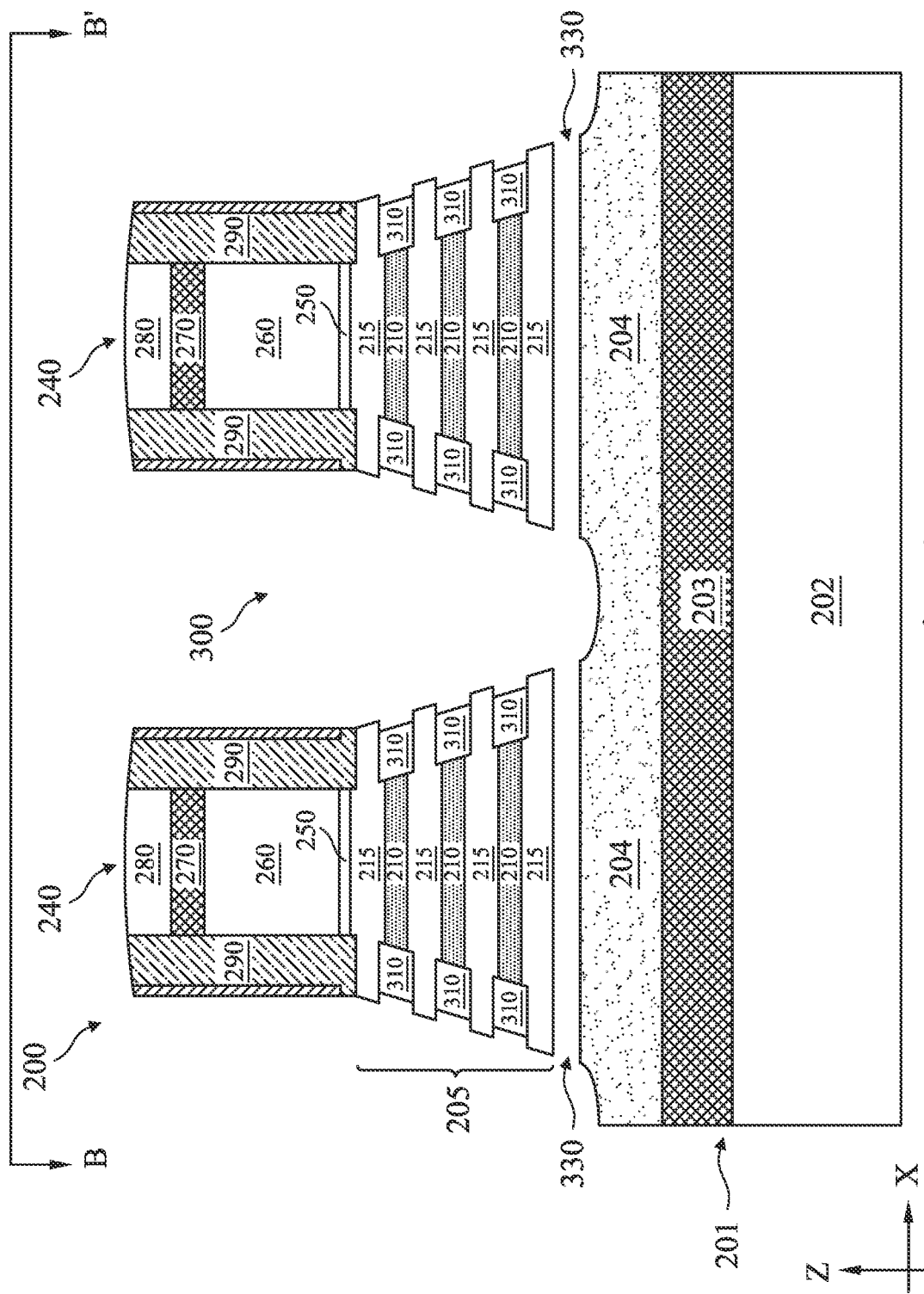

FIGS. 2-4 illustrate various cross-sectional side views of an IC device 200 at different stages of fabrication. In more detail, FIGS. 2-3 correspond to the cross-sectional cuts taken along a Y-direction, for example along the cutline A-A' in FIGS. 1A and 1C. As such, FIGS. 2-3 may be referred to as Y-cut Figures. FIG. 4 corresponds to a cross-sectional cut taken along an X-direction, for example along the cutline B-B' in FIGS. 1A and 1C. As such, FIG. 4 may be referred to as an X-cut Figure. For reasons of consistency and clarity, similar components appearing in FIGS. 2-4 will be labeled the same. It is also understood that FIGS. 2-4 have been simplified for the sake of clarity to better understand the inventive concepts of the present disclosure. Additional features can be added in the IC device 200, and some of the features described below can be replaced, modified, or eliminated in other embodiments of the IC device 200.

Referring to FIG. 2, the IC device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, memory devices, other suitable components, or combinations thereof.

The IC device 200 includes a substrate 201. In the depicted embodiment, the substrate 201 is a semiconductor-on-insulator substrate, such as a silicon-on-insulator (SOI) substrate, a silicon germanium-on-insulator (SGOI) substrate, or a germanium-on-insulator (GOI) substrate. In the depicted embodiment, the substrate 201 includes a carrier 202, an insulator 203, and a semiconductor substrate 204. In embodiments, the carrier 202 may be part of a silicon wafer, the insulator 203 may be silicon oxide, and the semiconductor substrate 204 can be silicon, silicon germanium, germanium, or other suitable semiconductor. Semiconductor-on-insulator substrates can be fabricated using separation by implantation of oxygen (SIMOX), wafer bonding, and/or other suitable methods. In an alternative embodiment, the substrate 201 is a bulk silicon substrate (i.e., including bulk single-crystalline silicon). The substrate 201 may include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof.

In some embodiment, the semiconductor substrate 204 may include various doped regions depending on design requirements of the device 200. For example, N-type doped regions, can be formed by doping with n-type dopants, such as phosphorus, arsenic, other n-type dopant, or combinations thereof; and P-type doped regions can be formed by doping with p-type dopants, such as boron, indium, other p-type dopant, or combinations thereof. In some implementations, the semiconductor substrate 204 includes doped regions formed with a combination of p-type dopants and n-type dopants. In some embodiment, the semiconductor substrate 204 is undoped or unintentionally doped with a very low number of dopants.

The IC device also includes a stack 205 of interleaving semiconductor layers that are formed over the substrate 201. In more detail, the semiconductor layer stack 205 includes semiconductor layers 210 and semiconductor layers 215 stacked vertically (e.g., along the Z-direction) in an interleaving or alternating configuration from a surface of the substrate 201. In some embodiments, the semiconductor layers 210 and semiconductor layers 215 are epitaxially grown in the depicted interleaving and alternating configuration. For example, a first one of semiconductor layers 210 is epitaxially grown on the semiconductor substrate 204, a first one of semiconductor layers 215 is epitaxially grown on the first one of semiconductor layers 210, a second one of semiconductor layers 210 is epitaxially grown on the first one of semiconductor layers 215, and a second one of semiconductor layers 215 is epitaxially grown on the second one of semiconductor layers 210, and so on until the semiconductor layers stack 205 has a desired number of semiconductor layers 210 and semiconductor layers 215. In such embodiments, semiconductor layers 210 and semiconductor layers 215 can be referred to as epitaxial layers. In some embodiments, epitaxial growth of the semiconductor layers 210 and semiconductor layers 215 is achieved by a molecular beam epitaxy (MBE) process, a chemical vapor deposition (CVD) process, a metalorganic chemical vapor deposition (MOCVD) process, other suitable epitaxial growth process, or combinations thereof.

A composition of the semiconductor layers 210 is different than a composition of the semiconductor layers 215 to achieve etching selectivity and/or different oxidation rates during subsequent processing. In some embodiments, the semiconductor layers 210 have a first etch rate to an etchant, and the semiconductor layers 215 have a second etch rate to the etchant, where the second etch rate is less than the first etch rate. In some embodiments, the semiconductor layers 210 have a first oxidation rate, and the semiconductor layers 215 have a second oxidation rate, where the second oxidation rate is less than the first oxidation rate. In the depicted embodiment, the semiconductor layers 210 and the semiconductor layers 215 include different materials, constituent atomic percentages, constituent weight percentages, thicknesses, and/or characteristics to achieve desired etching selectivity during an etching process, such as an etching process implemented to form suspended channel layers in channel regions of the IC device 200. For example, where the semiconductor layers 210 include silicon germanium and the semiconductor layers 215 include silicon, a silicon etch rate of the semiconductor layers 215 is less than a silicon germanium etch rate of the semiconductor layers 210. In some embodiments, the semiconductor layers 210 and the semiconductor layers 215 can include the same material but with different constituent atomic percentages to achieve the etching selectivity and/or different oxidation rates. For example, the semiconductor layers 210 and semiconductor layers 215 can include silicon germanium, where the semiconductor layers 210 have a first silicon atomic percent and/or a first germanium atomic percent and the semiconductor layers 215 have a second, different silicon atomic percent and/or a second, different germanium atomic percent. The present disclosure contemplates that the semiconductor layers 210 and the semiconductor layers 215 include any combination of semiconductor materials that can provide desired etching selectivity, desired oxidation rate differences, and/or desired performance characteristics (e.g., materials that maximize current flow), including any of the semiconductor materials disclosed herein.

As described further below, the semiconductor layers 215 or portions thereof form channel regions of the IC device 200. In the depicted embodiment, the semiconductor layer stack 205 includes four semiconductor layers 210 and four semiconductor layers 215 configured to form four semiconductor layer pairs disposed over the substrate 201, where each semiconductor layer pair has a respective first semiconductor layer 210 and a respective second semiconductor layer 215.

After undergoing subsequent processing, such a configuration will result in the IC device 200 having four channels. However, the present disclosure contemplates embodiments where the semiconductor layer stack 205 includes more or fewer semiconductor layers, for example, depending on a number of channels desired for the IC device 200 (e.g., a GAA transistor) and/or design requirements of the IC device 200. For example, the semiconductor layer stack 205 can include two to ten semiconductor layers 210 and two to ten semiconductor layers 215. In an alternative embodiment where the IC device 200 is a FinFET device, the stack 205 is simply one layer of a semiconductor material, such as one layer of Si. As will be discussed below, layers at both a front side and a back side of the substrate 201 will be processed. In the present disclosure, the side of the substrate 201 where the stack 205 is located is referred to as the frontside, and the side opposite the frontside (i.e., the side where the semiconductor layers 210 and 215 are located) is referred to as the backside.

Referring now to FIG. 3, fins 220 (also referred to as fin structures or fin stacks) are formed by patterning the stack 205 and the substrate 201 using one or more etching processes 230. The fins 220 include the patterned stack 205 (having the semiconductor layers 210 and 215), patterned semiconductor layers 204, and one or more patterned hard mask layers 225. The fins 220 may be patterned by any suitable method. For example, the fin 220 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the stack 205 and patterned using a photolithography process. Spacers may be formed alongside the patterned sacrificial layer using a self-aligned process. The sacrificial layer is then removed, and the remaining spacers, or mandrels, may then be used as a masking element for patterning the fins 220. For example, the masking element may be used for etching recesses into the stack 205 and the substrate 201, leaving the fins 220 on the substrate 201.

The etching processes may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $C_{12}$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchants.

According to various aspects of the present disclosure, the one or more etching processes 230 are performed such that a bottommost one of the semiconductor layers (labeled as the semiconductor layer 210A so as to differentiate from the rest of the semiconductor layers 210) is etched to have a tapered profiled in the cross-sectional view of FIG. 3. For example, the bottommost semiconductor layer 210A has side surfaces 232 that are tapered, or slanted, in the Y-direction. Another non-limiting way of characterizing the bottommost semiconductor layer 210A is that its bottom planar surface 233 (i.e., the surface facing the substrate 201, or the back side) is longer than its upper planar surface 234 (i.e., the surface facing the semiconductor layers 210 and 215 above, or the front side). For example, the bottom planar surface 233 has a lateral dimension 236 in the Y-direction, and the upper planar surface 234 has a lateral dimension 237 in the Y-direction, where the lateral dimension 236 is longer than the lateral dimension 237. In some embodiments, a ratio between the lateral dimension 236 and the lateral dimension 237 is greater than 1, and is in a range between about 5 and about 10. Such a ratio range is not randomly chosen but specifically configured (e.g., by tuning the various process parameters of the one or more etching processes 230) according to various aspects of the present disclosure. For example, such a ratio is chosen so that the bottommost semiconductor layer 210A is sufficiently tapered to help it prevent bridging (e.g., electrical shorting) between metal-containing gate structures and back side vias, both of which will be formed in subsequent processes, as will be discussed in more detail below. Meanwhile, such a ratio is also chosen so that the bottommost semiconductor layer 210A is not too long to interfere with the desired fabrication of other components of the IC 200 or otherwise increase fabrication complexities.

In some embodiments, the tapered profile of the bottommost semiconductor layer 210A is achieved by tuning the lateral etching aspect of the one or more etching processes. For example, in some embodiments, the one or more etching processes 230 use a chlorine-containing etchant (e.g., $Cl_2$) to etch the semiconductor layers 210 and 215 vertically in the Z-direction and use a fluorine-containing etchant (e.g., $SF_6$) to etch the semiconductor layers 210 and 215 in a horizontal or lateral direction (e.g., in the Y-direction). The lateral etching rate of the semiconductor layers 210 and 215 may be reduced by reducing the flow of the fluorine-containing etchant. As such, in order to achieve the tapered profile for the semiconductor layer 210A but not for the rest of the semiconductor layers 210 or 215, the etching processes 230 of the present disclosure are performed using a slower gas flow rate for the fluorine-containing etchant when the semiconductor layer 210A is etched than when the rest of the semiconductor layers 210 and 215 are etched.

For example, while the semiconductor layers 215 and the semiconductor layers 210 (other than the bottommost semiconductor layer 210A) are etched, a first flow rate is used for the fluorine-containing etchant. Accordingly, the lateral dimensions of the semiconductor layers 215 and the rest of the semiconductor layers 210 (other than the bottommost semiconductor layer 210A) may be substantially equal to one another. Alternatively stated, the semiconductor layers 215 and the rest of the semiconductor layers 210 may have substantially vertically straight sidewalls. However, by the time the bottommost semiconductor layer 210A is etched, a second flow rate is used for the fluorine-containing etchant, where the second flow rate is substantially lower (or slower) than the first flow rate. Due to this lower/slower flow rate, the bottommost semiconductor layer 210A is etched less (or more slowly) laterally than the other semiconductor layers 210 and 215, thereby giving it the tapered profile.

It is understood that although the present disclosure uses configuring the etchant flow rate as an example way to configure or achieve the tapered profile of the bottommost semiconductor layer 210A, it is not intended to be limiting. Other methods (e.g., configuring a biasing power during the etching processes 230 or using different types of etchants) of achieving such a tapered profile is also possible, but they are not discussed in detail herein for reasons of simplicity. It is also understood that the semiconductor substrate 204 may also exhibit at least a partially tapered profile due to the etching processes 230. For example, the etching processes 230 may cause the semiconductor substrate 204 to have a partially tapered side surface 238, such as shown in FIG. 3.

Referring now to FIG. 4, a different cross-sectional view of the IC device 200 is illustrated. As discussed above, whereas FIGS. 2-3 illustrate a cross-sectional view in the Y-Z plane (e.g., a Y-cut), FIG. 4 illustrates a cross-sectional view in the Y-X plane (e.g., an X-cut), taken along a cutline B-B' (also shown in FIGS. 1A and 1C). As shown in FIG. 4, gate stacks 240 are formed over the stack 205. In the present embodiment, the gate stacks 240 are dummy (or sacrificial) gate stacks and will be replaced with functional gate stacks (e.g., high-k metal gate stacks) later. The dummy gate stacks 240 are formed by deposition processes, lithography processes, etching processes, other suitable processes, or combinations thereof. For example, a deposition process is performed to form a dummy gate dielectric layer 250 over the semiconductor layer 215 and a dummy gate electrode layer 260 over the dummy gate dielectric layer 250. In some embodiments, the dummy gate dielectric layer 250 includes silicon oxide, and the dummy gate electrode layer 260 includes polysilicon. The deposition process may include CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), other suitable methods, or combinations thereof.

One or more hard mask layers, such as hard mask layers 270 and 280, are deposited over the dummy gate electrode layer 260. The hard mask layers 270 and 280 may include silicon oxide, silicon nitride, silicon oxynitride, silicon carbide, or other suitable materials. A lithography patterning and etching process is then performed to pattern the one or more hard mask layers 270-280, the dummy gate electrode layer 260, and the dummy gate dielectric layer 250 to form the dummy gate stacks 240, as depicted in FIG. 4. The lithography patterning processes may include resist coating (for example, spin-on coating), soft baking, mask aligning, exposure, post-exposure baking, developing the resist, rinsing, drying (for example, hard baking), other suitable lithography processes, or combinations thereof. The etching processes include dry etching processes, wet etching processes, other etching methods, or combinations thereof.

Gate spacers 290 may be on sidewalls of the dummy gate stacks 240. The gate spacers 290 are formed by any suitable process and include a dielectric material. The dielectric material can include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). For example, a dielectric layer including silicon and nitrogen, such as a silicon nitride layer, can be deposited over dummy gate stacks 240 and subsequently etched (e.g., anisotropically etched) to form gate spacers 290. In some embodiments, gate spacers 290 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to dummy gate stacks 240. In such implementations, the various sets of spacers can include materials having different etch rates. For example, a first dielectric layer including silicon and oxygen (e.g., silicon oxide) can be deposited and etched to form a first spacer set adjacent to dummy gate stacks 240, and a second dielectric layer including silicon and nitrogen (e.g., silicon nitride) can be deposited and etched to form a second spacer set adjacent to the first spacer set.

Source/drain (S/D) trenches 300 may be formed by etching the fins adjacent the gate spacers 290. In the depicted embodiment, an etching process completely removes the portion of the semiconductor layer stack 205 in the source/drain regions, thereby exposing the substrate portion 204 of the fins 220 in the source/drain regions. The source/drain trenches 300 thus have sidewalls defined by remaining portions of the semiconductor layer stack 205, which are disposed in channel regions under the gate stacks 240, and bottoms defined by the substrate 201. In some embodiments, the etching process removes some, but not all, of semiconductor layer stack 205, such that the source/drain trenches 300 have bottoms defined by semiconductor layer 210 or semiconductor layer 215 in source/drain regions. In some embodiments, the etching process further removes some, but not all, of the substrate portion of fins 220, such that source/drain trenches 300 extend below a topmost surface of the substrate 201. For example, a portion of the semiconductor substrate 204 may be recessed. The etching process can include a dry etching process, a wet etching process, other suitable etching process, or combinations thereof. In some embodiments, the etching process is a multi-step etch process. For example, the etching process may alternate etchants to separately and alternately remove the semiconductor layers 210 and semiconductor layers 215. In some embodiments, parameters of the etching process are configured to selectively etch semiconductor layer stack with minimal (to no) etching of the gate stacks 240.

Still referring to FIG. 4, inner spacers 310 along sidewalls of the semiconductor layers 210 inside the S/D trenches 300. For example, a first etching process is performed that selectively etches the semiconductor layers 210 exposed by source/drain trenches 300 with minimal (to no) etching of semiconductor layers 215, such that gaps are formed between semiconductor layers 215 and between semiconductor layers 215 and semiconductor substrate 204 under the gate spacers 290. Portions (edges) of the semiconductor layers 215 are thus suspended in the channel regions under the gate spacers 290. In some embodiments, the gaps extend partially under the dummy gate stacks 240. The first etching process is configured to laterally etch (e.g., along the "X" direction) the semiconductor layers 210, thereby reducing a length of semiconductor layers 210 along the "X" direction. The first etching process may be a dry etching process, a wet etching process, other suitable etching process, or combinations thereof.

A deposition process then forms a spacer layer over the gate structures 240 and over features defining the source/drain trenches 300 (e.g., semiconductor layers 215, semiconductor layers 210, and semiconductor substrate 204), such as CVD, PVD, ALD, HDPCVD, MOCVD, RPCVD, PECVD, LPCVD, ALCVD, APCVD, other suitable methods, or combinations thereof. The spacer layer partially (and, in some embodiments, completely) fills the source/drain trenches 300. The deposition process is configured to ensure that the spacer layer fills the gaps between the semiconductor layers 215 and between semiconductor layers 215 and the substrate 201 under gate spacers 290.

A second etching process is then performed that selectively etches the spacer layer to form the inner spacers 310 as depicted in FIG. 4 with minimal (or no) etching of the semiconductor layers 215, dummy gate stacks 240, and gate spacers 290. In some embodiments, the spacer layer is removed from sidewalls of gate spacers 290, sidewalls of semiconductor layers 215, dummy gate stacks 240, and substrate 201. The spacer layer (and thus inner spacers 310) includes a material that is different than a material of semiconductor layers 215 and a material of gate spacers 290 to achieve desired etching selectivity during the second etching process. In some embodiments, the spacer layer 255 includes a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, the inner spacer layer includes a low-k dielectric material, such as those described herein. In embodiments where the device 200 is a FinFET, the inner spacer 310 may be omitted.

As shown in FIG. 4, the bottommost semiconductor layer 210A is removed, for example using one or more etching processes (e.g., dry etching). The removal of the bottommost semiconductor layer 210A does not substantially affect the rest of the semiconductor layers 210 or 215. The removal of the bottommost semiconductor layer 210A also leaves recesses 330 between the semiconductor substrate 204 and the bottommost semiconductor layer 215.

Figure 5:
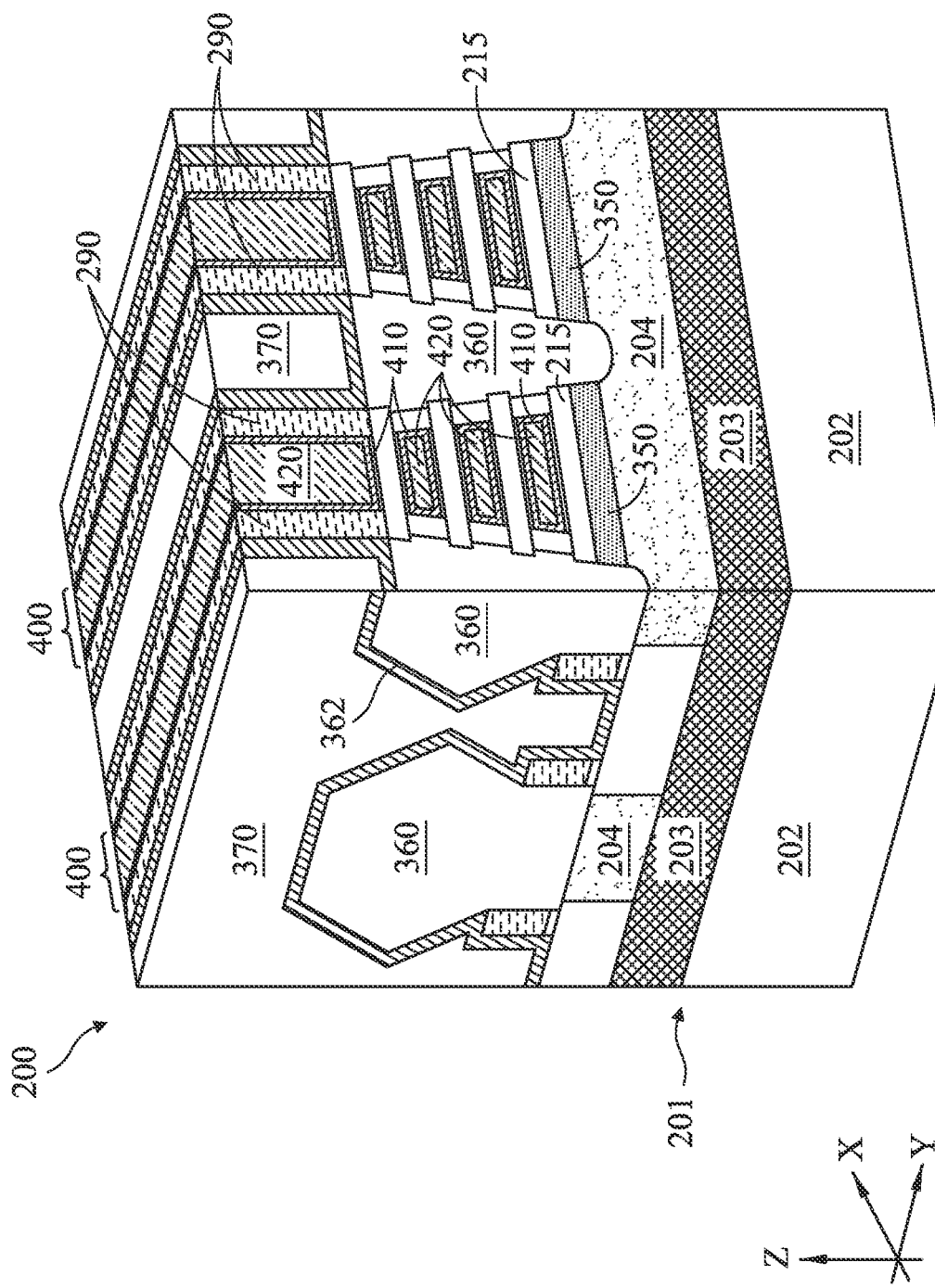
FIGS. 5-11 are perspective three-dimensional views of an embodiment of an IC device at various stages of fabrication according to various aspects of the present disclosure.

FIGS. 5-10 illustrate a series of diagrammatic perspective three-dimensional (3D) view of the IC device 200 at different stages of fabrication subsequent to the stage of fabrication illustrated in FIG. 4. Referring to FIG. 5, a dielectric layer 350 is formed in the recesses 330 in place of the removed bottommost semiconductor layer 210A. As such, the dielectric layer 350 may also have a tapered profile in the Y-direction, which is not directly visible in FIG. 5. The dielectric layer 350 may be formed using a suitable deposition process, such as ALD, CVD, PVD, or combinations thereof. In some embodiments, the dielectric layer 350 may include silicon carbon nitride (SiCN). The dielectric layer 350 may serve as an etching-stop layer in a later process where back side vias are etched. According to various aspects of the present disclosure, due to its tapered profile, the dielectric layer 350 may be able to prevent undesirable bridging between the back side via and metal gate structures (both of which will be formed later).

Epitaxial S/D features 360 are grown from the semiconductor substrate 204 and from the semiconductor layers 215. The epitaxial S/D features 360 fill the S/D trenches 300. The epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of the semiconductor substrate 204 and semiconductor layers 215. The epitaxial S/D features 360 may be are doped with n-type dopants or p-type dopants for n-type transistors or p-type transistors respectively. In some embodiments, for n-type transistors, epitaxial S/D features 360 include silicon and can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for p-type transistors, epitaxial S/D features 360 include silicon germanium or germanium and can be doped with boron, other p-type dopant, or combinations thereof (for example, forming Si:Ge:B epitaxial source/drain features). In some embodiments, epitaxial S/D features 360 include more than one epitaxial semiconductor layer, where the epitaxial semiconductor layers can include the same or different materials and/or dopant concentrations. In some embodiments, epitaxial S/D features 360 include materials and/or dopants that achieve desired tensile stress and/or compressive stress in respective channel regions. In some embodiments, epitaxial S/D features 360 are doped during deposition by adding impurities to a source material of the epitaxy process (i.e., in-situ). In some embodiments, epitaxial S/D features 360 are doped by an ion implantation process subsequent to a deposition process. In some embodiments, annealing processes (e.g., rapid thermal annealing (RTA) and/or laser annealing) are performed to activate dopants in epitaxial source/drain features 360.

A dielectric layer 362 may be deposited on the top surface and the sidewall surfaces of the S/D features 360 and on the surfaces of the S/D trenches 300. In various embodiments, the dielectric layer 362 may include alumina ($Al_2O_3$), other oxides, silicon nitride ($Si_3N_4$), silicon carbonitride (SiCN), silicon oxycarbonitride (SiOCN), or other dielectric materials.

An ILD layer 370 is deposited over the dielectric layer 362 and fills the space between opposing gate spacers 290 (see FIG. 4). The ILD layer 370 may comprise tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD 370 may be formed by PECVD (plasma enhanced CVD), FCVD (flowable CVD), or other suitable methods. Subsequent to the formation of the ILD layer 370, a CMP process and/or other planarization process can be performed until reaching (exposing) a top portion (or top surface) of dummy gate stacks 240 (see FIG. 4).

Still referring to FIG. 5, a gate replacement process may be performed to replace the dummy gate stacks 240 with functional gate stacks 400 (such as high-k metal gates). First, the dummy gate stacks 240 (the dummy gate electrodes 260 and the dummy gate dielectric layer 250, see FIG. 4) are removed using one or more etching processes. In some embodiments, the etching process is a multi-step etch process. For example, the etching process may alternate etchants to separately remove various layers of dummy gate stacks 240. In some embodiments, the etching process is configured to selectively etch dummy gate stacks 240 with minimal (to no) etching of other features of the device 200, such as ILD layer 370, gate spacers 290, semiconductor layers 215, and semiconductor layers 210, etc. The removal of the dummy gate stacks 240 forms a gate trench in place of each of the removed dummy gate stacks 240.

Next, the semiconductor layers 210 exposed in the gate trench are removed, thereby leaving the semiconductor layers 215 suspended over the semiconductor substrate 204 and connected with the S/D features 360. This process is also referred to as a channel release process, and the semiconductor layers 215 are also referred to as channel layers (or nano-structure channels). In some embodiments, the channel release process selectively etches away the semiconductor layers 210 with minimal (to no) etching of the semiconductor layers 215 and, in some embodiments, minimal (to no) etching of the gate spacers 290 and/or inner spacers 310. In embodiments where the device 200 is a FinFET, the channel release process may be omitted because there is only a channel layer 215 and there are no semiconductor layers 210 in the channel region.

Thereafter, a gate dielectric layer 410 is formed that circumferentially wraps around (e.g., in an Y-Z plane) each of the semiconductor layers 215, and a gate electrode 420 is formed over the gate dielectric layer 410, as a part of the formation of the functional gate stack 400. The gate dielectric layer 410 may include a high-k dielectric material such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). The gate dielectric layer 410 may be formed by chemical oxidation, thermal oxidation, atomic layer deposition (ALD), chemical vapor deposition (CVD), and/or other suitable methods. It is also understood that, in some embodiments, the gate stack 400 may further include an interfacial layer between the gate dielectric layer 410 and the channel layers 215. The interfacial layer may include silicon dioxide, silicon oxynitride, or other suitable materials.

The gate electrode layer 420 may include an n-type or a p-type work function layer and a fill metal layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a fill metal layer may include aluminum, tungsten, cobalt, copper, and/or other suitable materials. The gate electrode layer 420 may be formed by CVD, PVD, plating, and/or other suitable processes. Since the gate stack 400 includes a high-k dielectric layer and metal layer(s), it is also referred to as a high-k metal gate.

Figure 6:
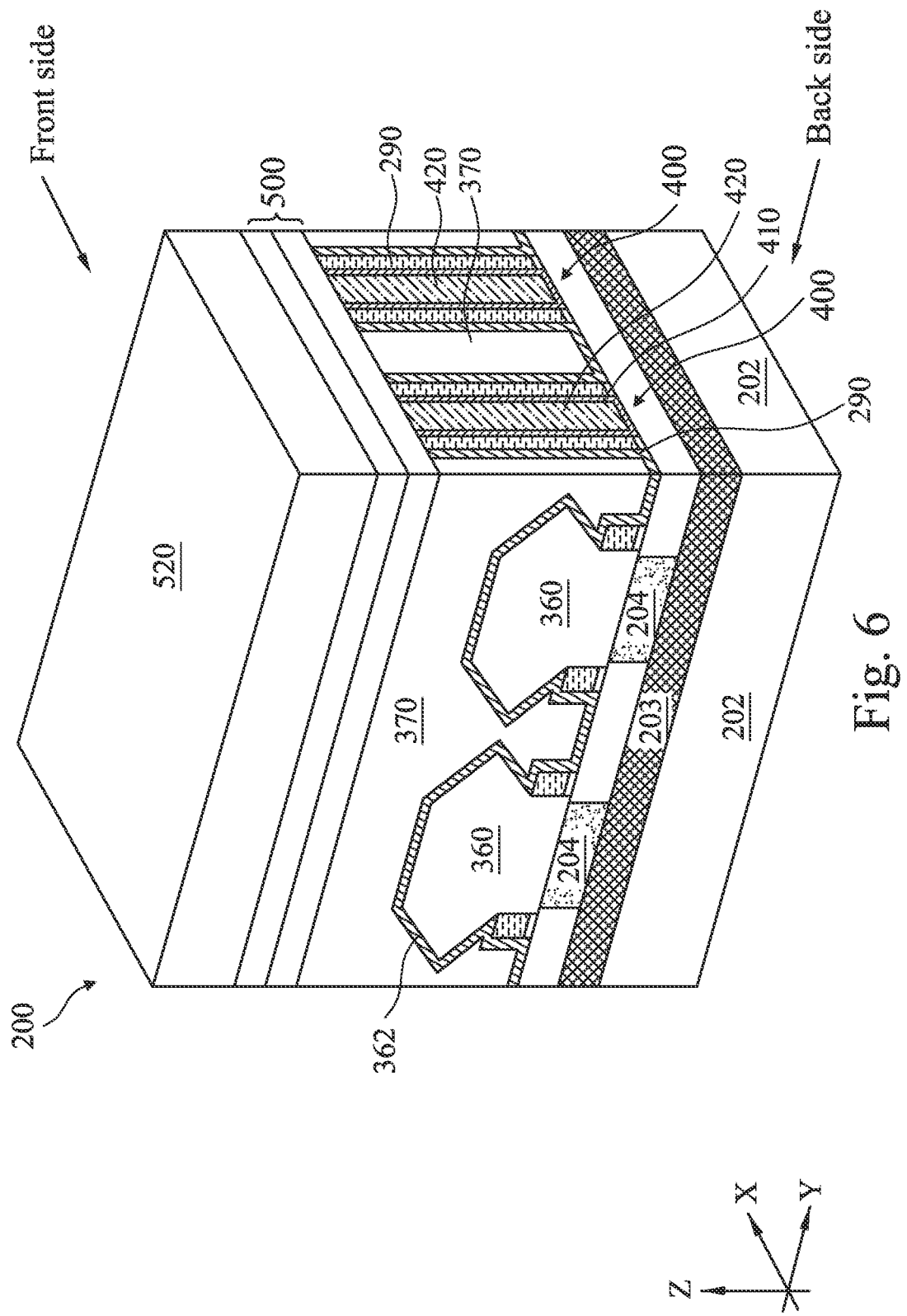

Referring now to FIG. 6, mid-end-of-line (MEOL) processes and back-end-of-line (BEOL) processes are performed at the frontside of the device 200 to form an interconnect structure 500. For example, the interconnect structure 500 may include gate vias that provide electrical connectivity to the gate stacks 400, S/D contact vias that provide electrical connectivity to the S/D features 360, as well as one or more interconnect layers with wires (i.e., metal lines) and vias embedded in dielectric layers. Passivation layer(s) may also be formed over the interconnect layers.

A carrier substrate 520 is then bonded or otherwise attached to the IC device 200 from the front side. This may be done via any suitable attaching process, such as direct bonding, hybrid bonding, using adhesives, or other bonding methods. The bonding may further include alignment, annealing, and/or other processes. The carrier substrate 520 may include a silicon wafer in some embodiments.

Figure 7:
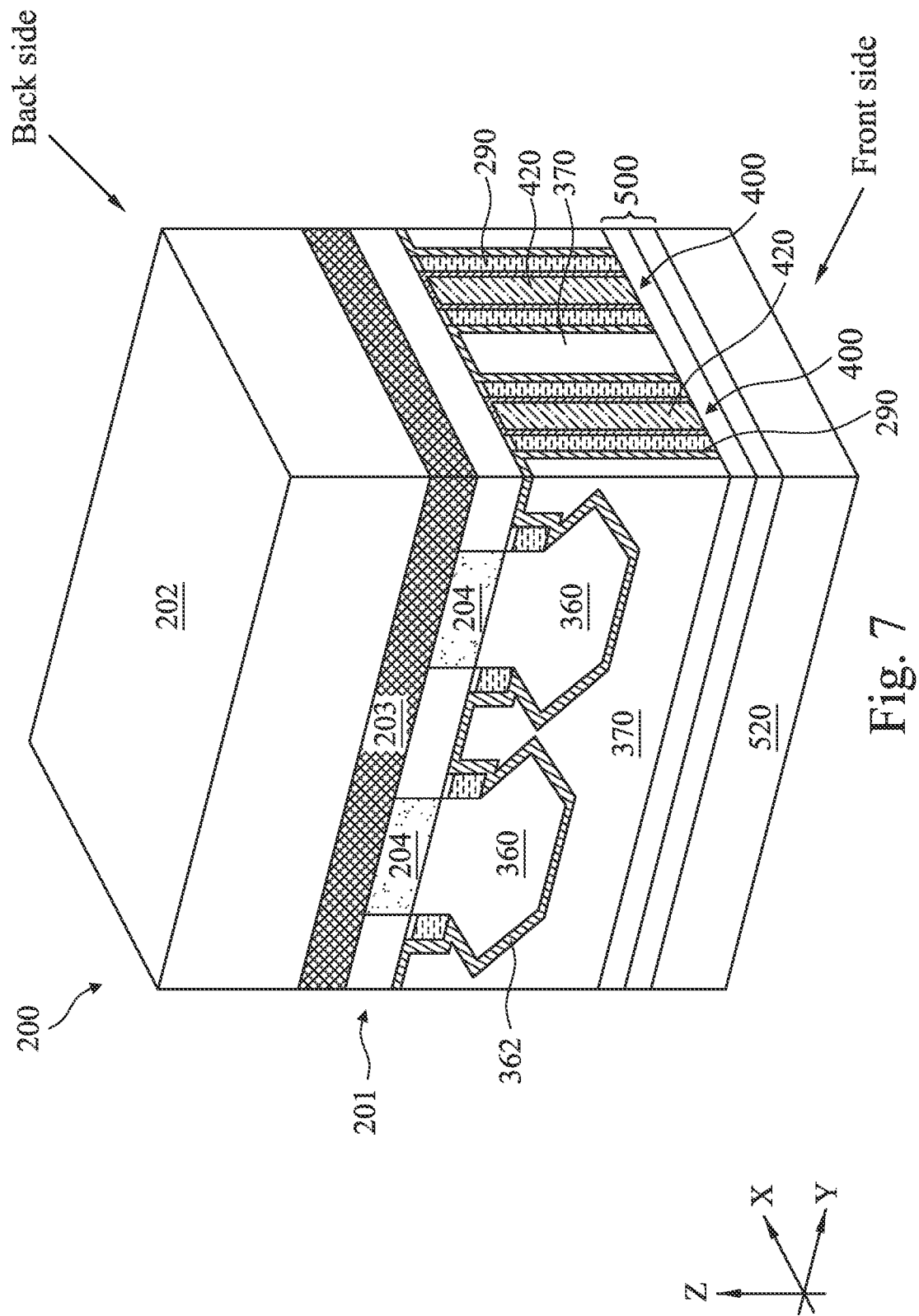

Referring now to FIG. 7, the IC device 200 is flipped vertically upside down in the Z-direction, such that the back side of the IC device 200 is accessible for further processing.

Figure 8:
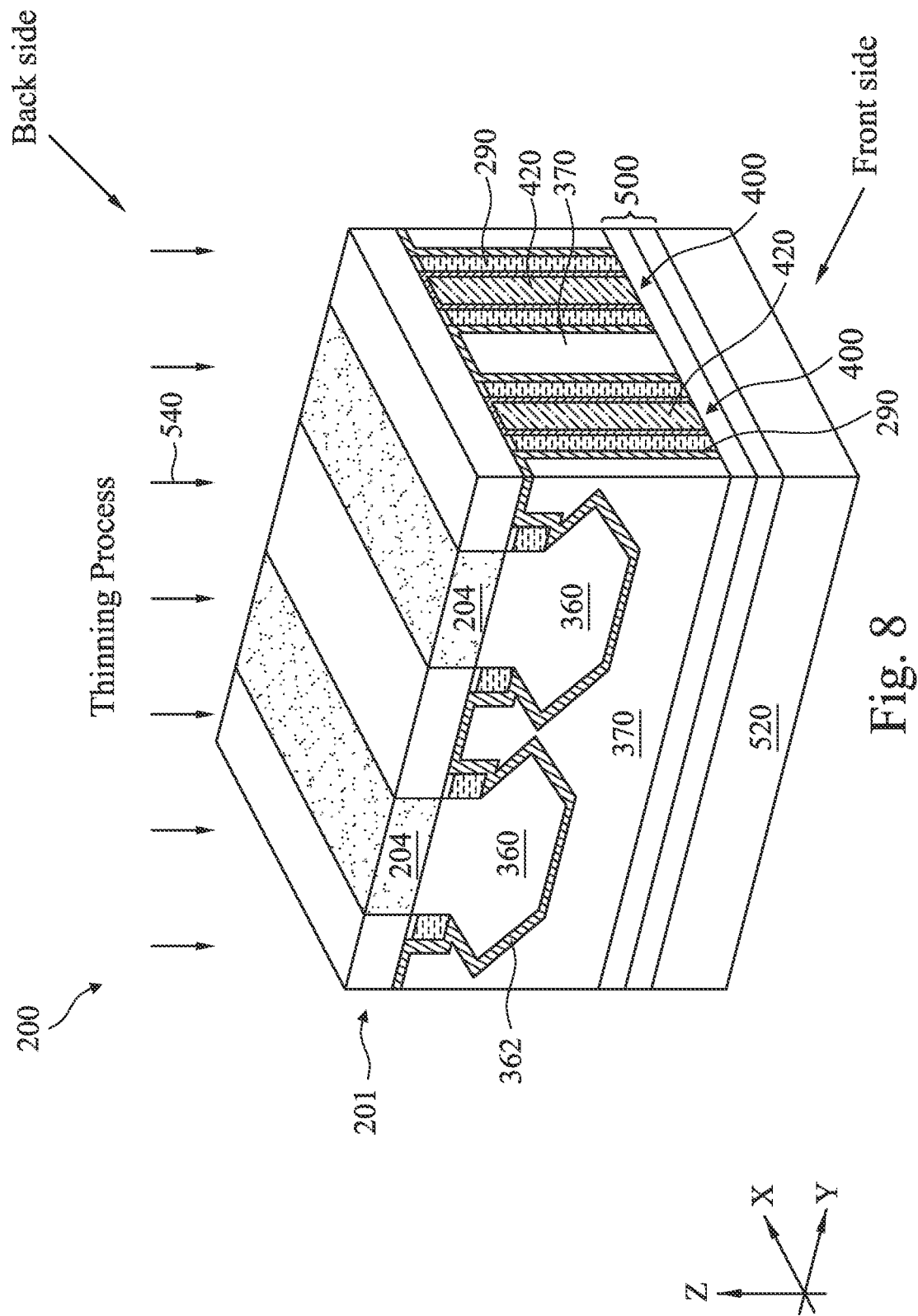

Referring now to FIG. 8, a thinning process 540 is performed from the back side of the IC device 200 to thin down the substrate 201. For example, the thinning process 540 removes the carrier substrate 202 and the insulator 203, such that the semiconductor substrate 204 is exposed from the back side of the IC device 200. In some embodiments, the thinning process 540 may include a mechanical grinding process and/or a chemical thinning process. A substantial amount of substrate material may be first removed from the substrate 201 during a mechanical grinding process. Afterwards, a chemical thinning process may apply an etching chemical to the backside of the substrate 201 to further thin down the substrate 201.

Figure 9:
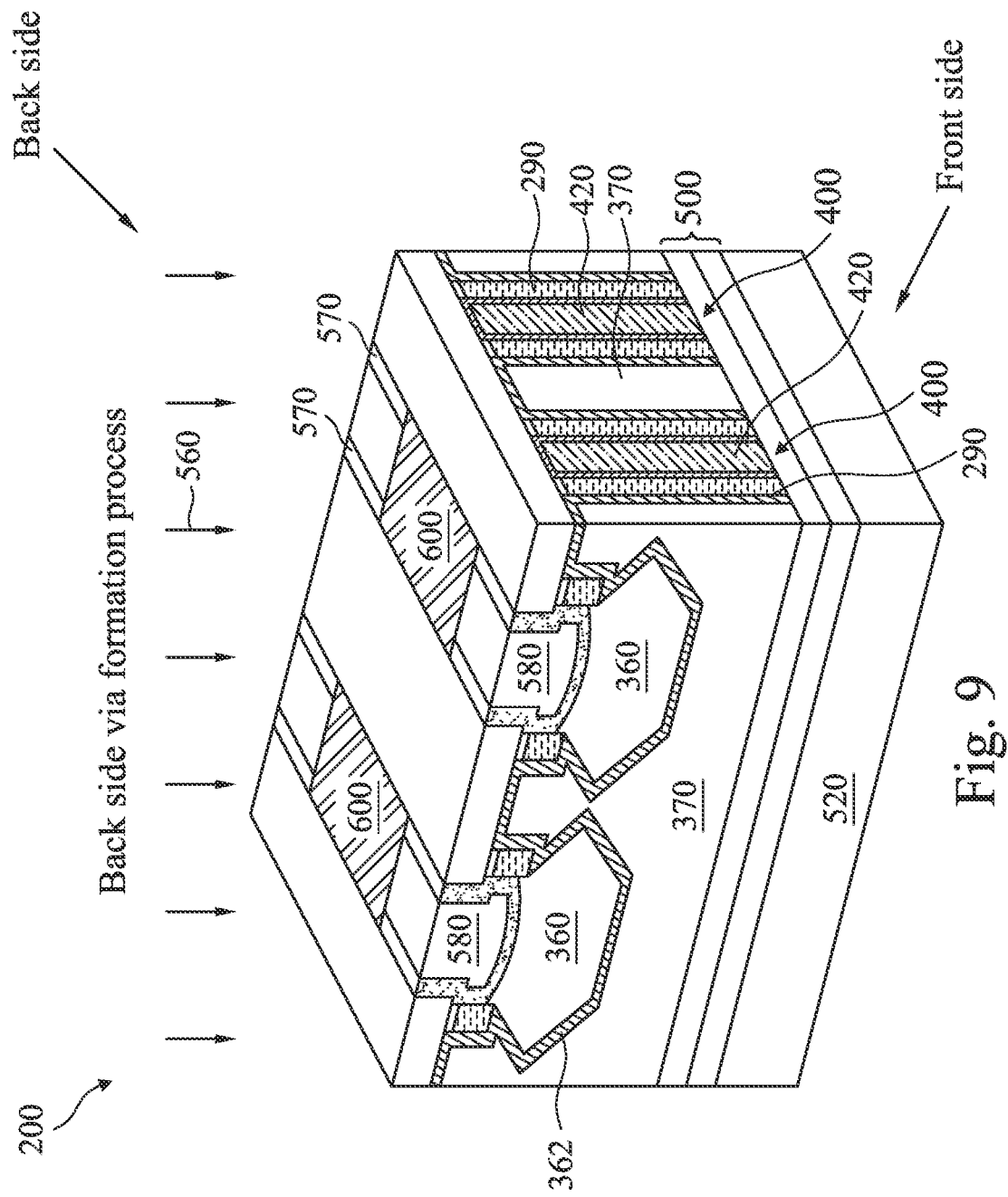
Figure 10:
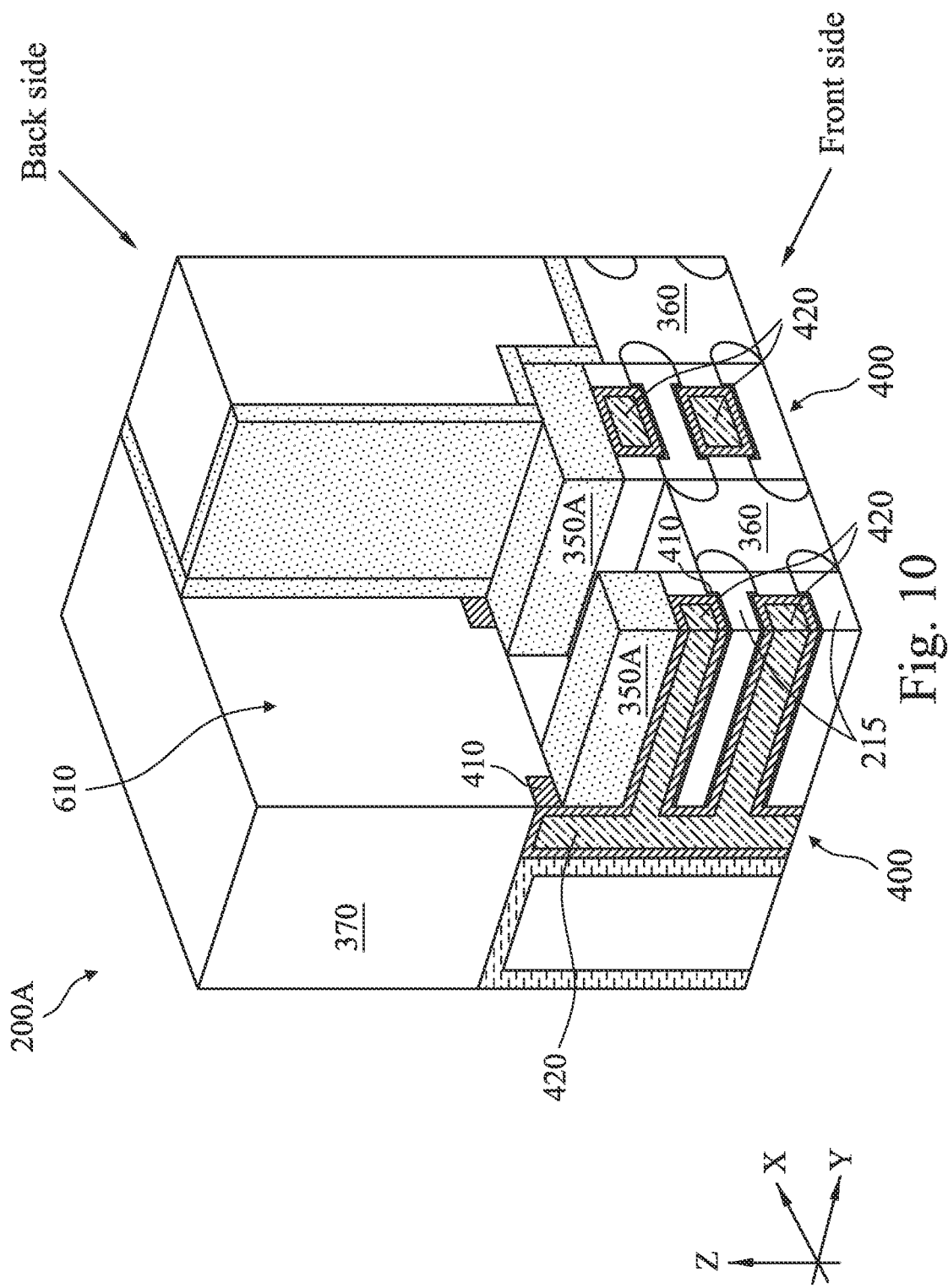

Referring now to FIG. 9, a back side via formation process 560 is performed to form back side vias 600 of the IC device 200. The back side via formation process 560 may include etching processes to selectively etch the semiconductor substrate 204 to form trenches over the backside of the gate stacks 400 and the S/D features 360. The etching processes are tuned to be selective to the materials of the semiconductor substrate 204 (such as Si in an embodiment) and with no (or minimal) etching to the S/D features 360, the gate stacks 400 (particularly the gate dielectric layer 410 and the gate interfacial layer if present), or any isolation structures. The etching process can be dry etching, wet etching, reactive ion etching, or other etching methods. A dielectric liner 570 is formed in the resulting trenches, and then a dielectric layer 580 is formed over the dielectric liner 580. In some embodiments, the dielectric liner 570 includes silicon nitride (SiN), or $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Y_2O_3$, AlON, TaCN, or ZrSi. In some embodiments, the dielectric layer 580 includes silicon oxide ($SiO_2$), or tetra-ethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), and/or other suitable dielectric materials. The dielectric layer 580 may be formed by PECVD (plasma enhanced CVD), FCVD (flowable CVD), or other suitable methods. A CMP process may also be performed to planarize the backside of the IC device 200.

The back side via formation process 560 then etches via holes in the dielectric layer 580 from the back side. The via holes expose the S/D feature 360 from the backside of the IC device 200. The etching process can be dry etching, wet etching, reactive ion etching, or other etching methods. The back side via formation process 560 then deposits a conductive material (e.g., cobalt, tungsten, copper, aluminum, titanium, or combinations thereof) in the via holes to form back side vias 600. The back side vias 600 provide electrical connectivity to the S/D features from the back side, and as such they may also be referred to as S/D vias.

Figure 11:
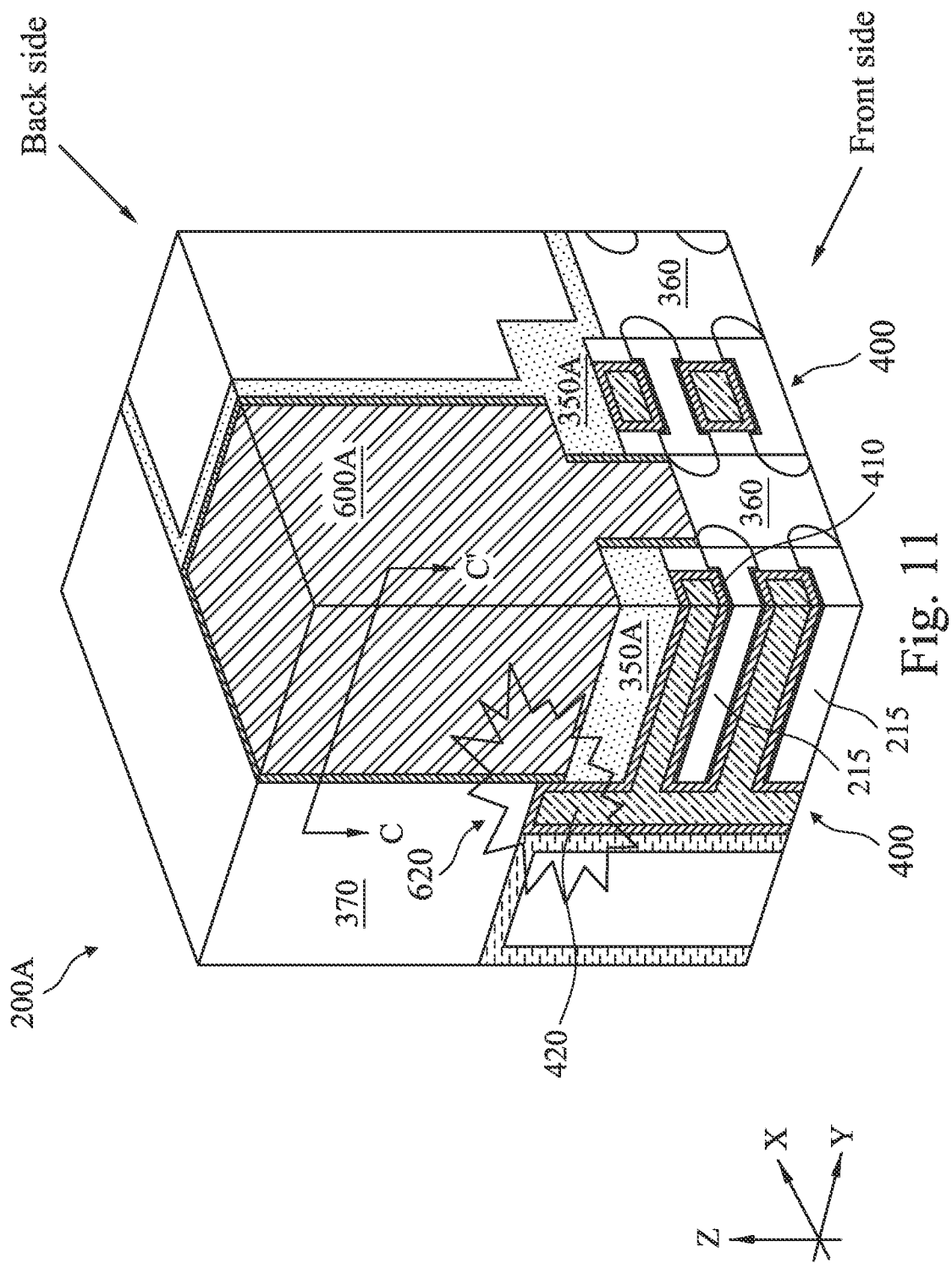

As discussed above, one of the aspects of the present disclosure pertains to reducing electrical bridging risks between the back side vias 600 and the gate structures 400. This is more clearly illustrated in FIG. 10, which is a diagrammatic perspective three-dimensional view of an IC device 200A that is similar to the IC device 200, but without implementing the tapered profile for its dielectric layer 350A. In other words, for the IC device 200A, its bottommost semiconductor layer 210 has a substantially vertically straight sidewall profile, which leads to a substantially vertically straight sidewall profile for its dielectric layer 350A when the dielectric layer 350 is formed to replace its bottommost semiconductor layer 210. During the etching of the via hole 610, it can be seen that a portion of the gate structures 400 (e.g., the gate dielectric layer 410, or possible even the gate electrode 420) may become exposed by the via hole 610. This exposed portion of the gate structures 400 may come into contact with a subsequently formed back side via 600A, such as shown in FIG. 11. As such, a problematic region 620 (see FIG. 11) may exist in the IC device 200A, where the back side via 600A and the gate structure 400 may be vulnerable for electrical bridging. Since the back side via 600A is meant to provide electrical connectivity to the S/D features 360, and not the gate structure 400, the electrical bridging between the back side via 600A and the gate structure 400 is undesirable, as it could degrade device performance or cause device failures. As device sizes shrink, the electrical bridging risks may be exacerbated, since any small shift of the location of the back side via 600A could cause it to come into direct physical contact with the gate structure 400.

Figure 12:
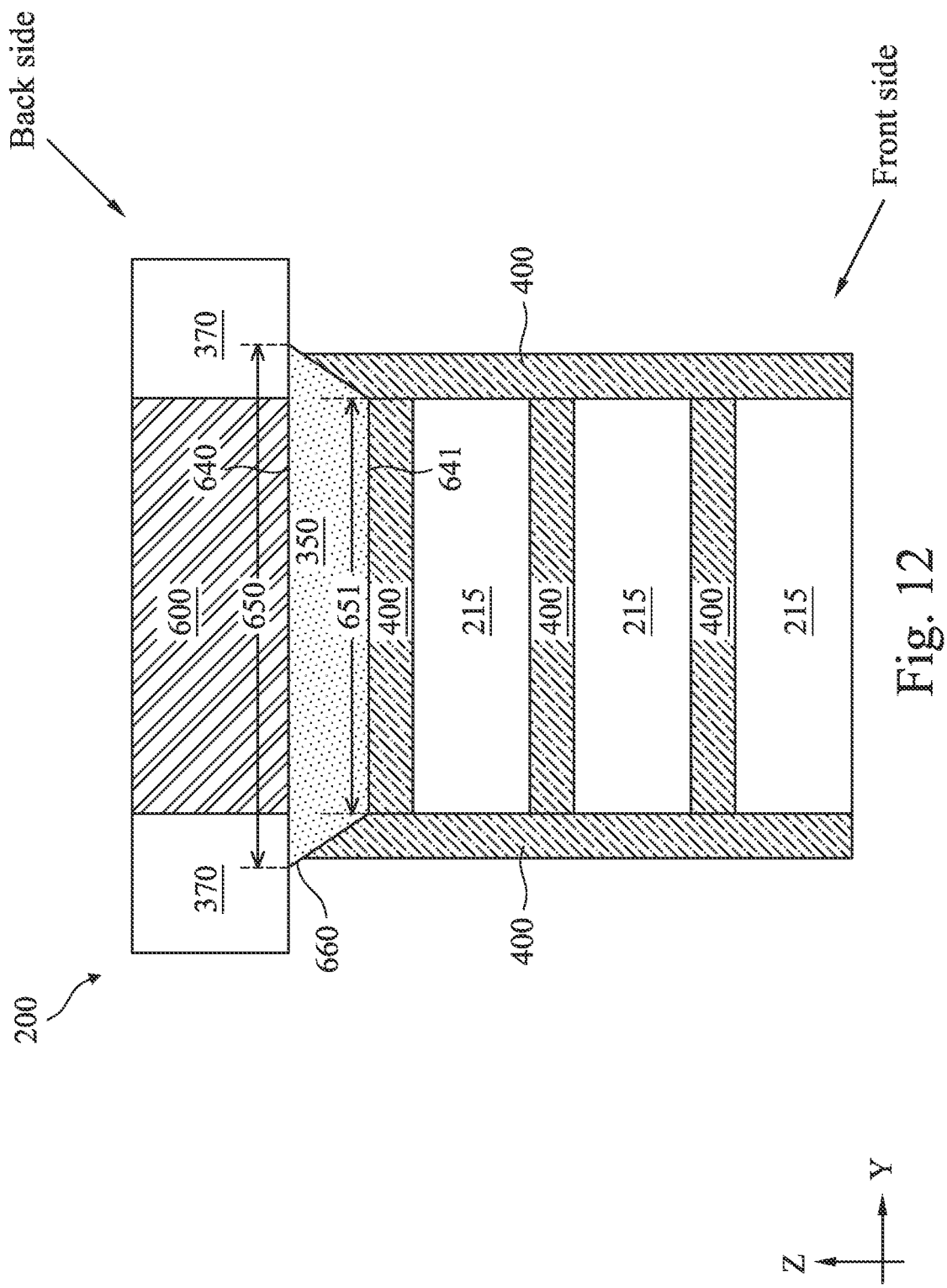
FIG. 12 is a cross-sectional side view of an embodiments of an IC device at a stage of fabrication according to various aspects of the present disclosure.

The present disclosure prevents the electrical bridging problem discussed above, since the tapered profile of the dielectric layer 350 effectively separates the back side via 600 and the nearby gate structure 400. This is clearly illustrated in FIG. 12, which is a cross-sectional view of a portion of the IC device 200 taken in the Y-Z plane. The cross-section may be taken along a cutline C-C' shown in FIG. 11.

As discussed above, the dielectric layer 350 substantially inherits the profile of the bottommost semiconductor layer 210A shown in FIG. 3. As such, the dielectric layer 350 has a tapered profile in the cross-sectional view too. Another way of describing the tapered profile of the dielectric layer 350 is that the dielectric layer 350 has a planar surface 640 that is facing the back side via 600 and a planar surface 641 that is facing the gate structure 400, where the planar surface 640 is substantially longer than the planar surface 641. In some embodiments, the planar surface 640 and the planar surface 641 have lateral dimensions 650 and 651, respectively, in the Y-direction, where a ratio between the lateral dimension 650 and the lateral dimension 651 is greater than 1, and is in a range between about 5 and about 10. Such a ratio range is not randomly chosen but specifically configured (e.g., by tuning the various process parameters of the one or more etching processes 230, see FIG. 3 and the accompanying discussions) according to various aspects of the present disclosure. For example, such a ratio is chosen so that the dielectric layer 350 extends out laterally in the Y-direction (i.e., tapered), so that it can prevent the back side via 600 from coming into direct physical contact with the gate structure 400. For example, a side surface 660 is tapered or slanted (in the Y-direction), and it is this tapered side surface 660 that is in direct contact with the gate structure 400. This is due at least in part to the fact that the dielectric layer 350 serves as an etching-stop layer when the back side via hole was etched. Thus, the back side via hole stops at the planar surface 640 of the dielectric layer 350 and does not extend to a point where it could expose the gate structure 400. Consequently, electrical bridging between the back side via 600 and the gate structure 400 may be prevented.

It is also noted that the planar surface 640 of the dielectric layer 350 may be longer than the semiconductor layers 215 (e.g., the nano-structure channels of the IC device 200) as well. In that regard, the semiconductor layers 215 may have lateral dimensions in the Y-direction that are substantially equal to the lateral dimension 651.

Figure 13:
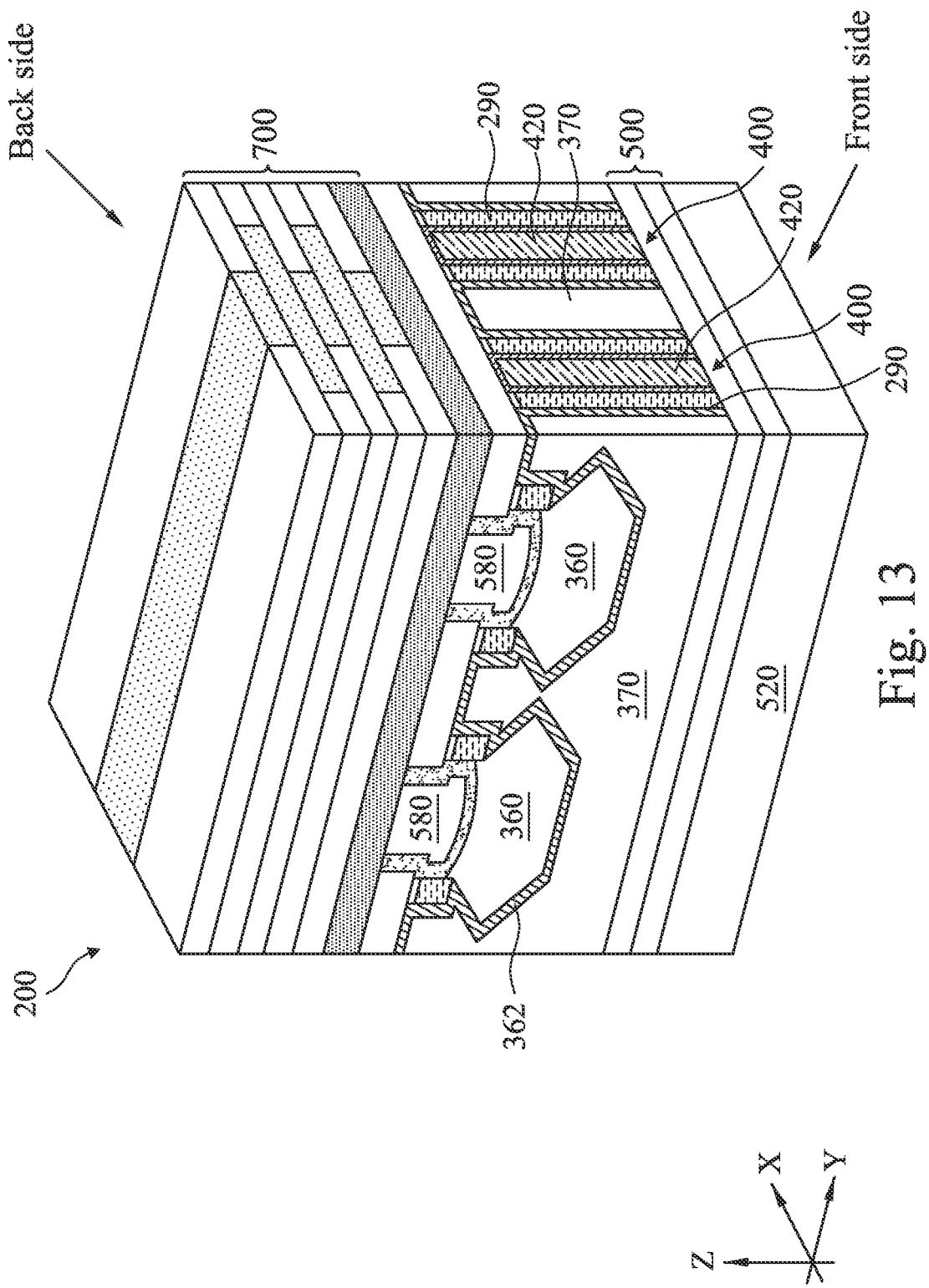
FIG. 13 is a perspective three-dimensional view of an embodiment of an IC device at a stage of fabrication according to various aspects of the present disclosure.

Referring now to FIG. 13, an interconnect structure 700 is formed over the back side of the IC device 200. Similar to the interconnect structure 500, the interconnect structure 700 may also include a plurality of interconnect layers, where metal lines (or wires) and vias are formed therein. The interconnect structure 700 provides further electrical connectivity to the IC device 200.

Figure 14:
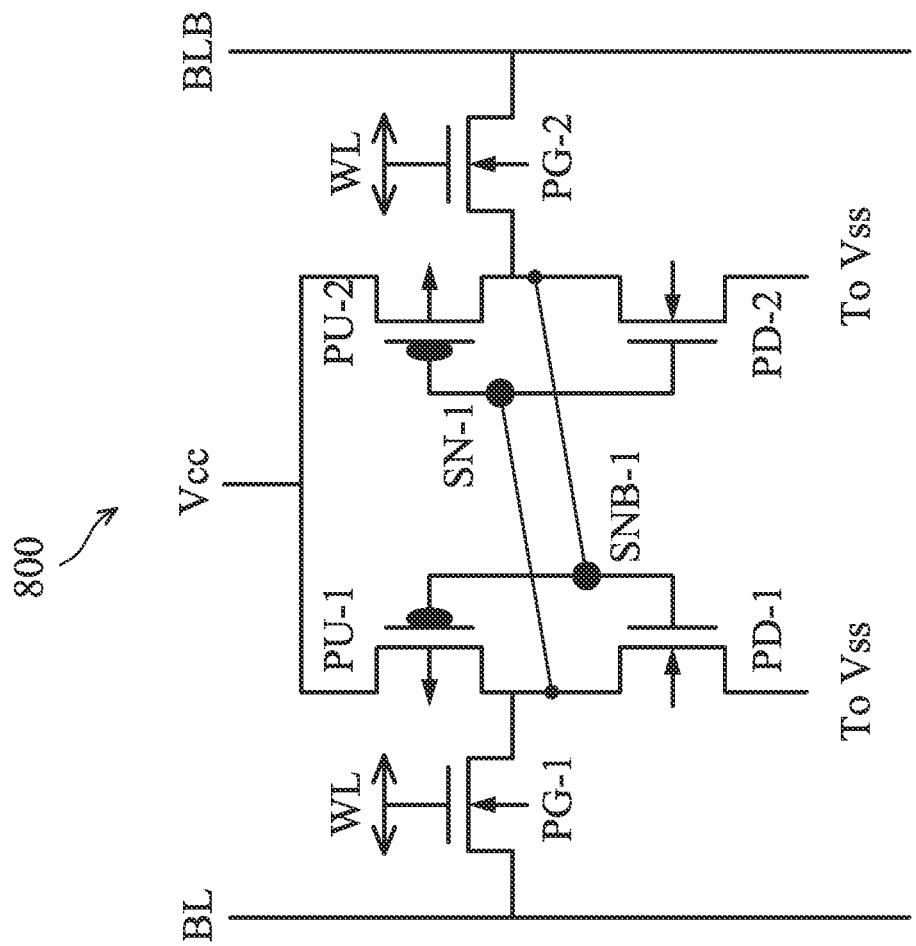
FIG. 14 is a circuit schematic of an SRAM cell according to various aspects of the present disclosure.

It is understood that the IC device 200 may be implemented in a variety of IC applications, including memory devices such as Static Random-Access Memory (SRAM) devices. In that regard, FIG. 14 illustrates an example circuit schematic for a single-port SRAM cell (e.g., 1-bit SRAM cell) 800. The single-port SRAM cell 800 includes pull-up transistors PU1, PU2; pull-down transistors PD1, PD2; and pass-gate transistors PG1, PG2. As show in the circuit diagram, transistors PU1 and PU2 are p-type transistors, and transistors PG1, PG2, PD1, and PD2 are n-type transistors. According to the various aspects of the present disclosure, the PG1, PG2, PD1, and PD2 transistors are implemented with thinner spacers than the PU1 and PU2 transistors. Since the SRAM cell 800 includes six transistors in the illustrated embodiment, it may also be referred to as a 6T SRAM cell.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a first data latch. The gates of transistors PU2 and PD2 are coupled together and to the drains of transistors PU1 and PD1 to form a first storage node SN1, and the gates of transistors PU1 and PD1 are coupled together and to the drains of transistors PU2 and PD2 to form a complementary first storage node SNB1. Sources of the pull-up transistors PU1 and PU2 are coupled to power voltage Vcc (also referred to as Vdd), and the sources of the pull-down transistors PD1 and PD2 are coupled to a voltage Vss, which may be an electrical ground in some embodiments.

The first storage node SN1 of the first data latch is coupled to bit line BL through pass-gate transistor PG1, and the complementary first storage node SNB1 is coupled to complementary bit line BLB through pass-gate transistor PG2. The first storage node N1 and the complementary first storage node SNB1 are complementary nodes that are often at opposite logic levels (logic high or logic low). Gates of pass-gate transistors PG1 and PG2 are coupled to a word line WL. SRAM devices such as the SRAM cell 800 may be implemented using FinFET devices and/or with GAA devices implemented according to various aspects of the present disclosure.

Figure 15:
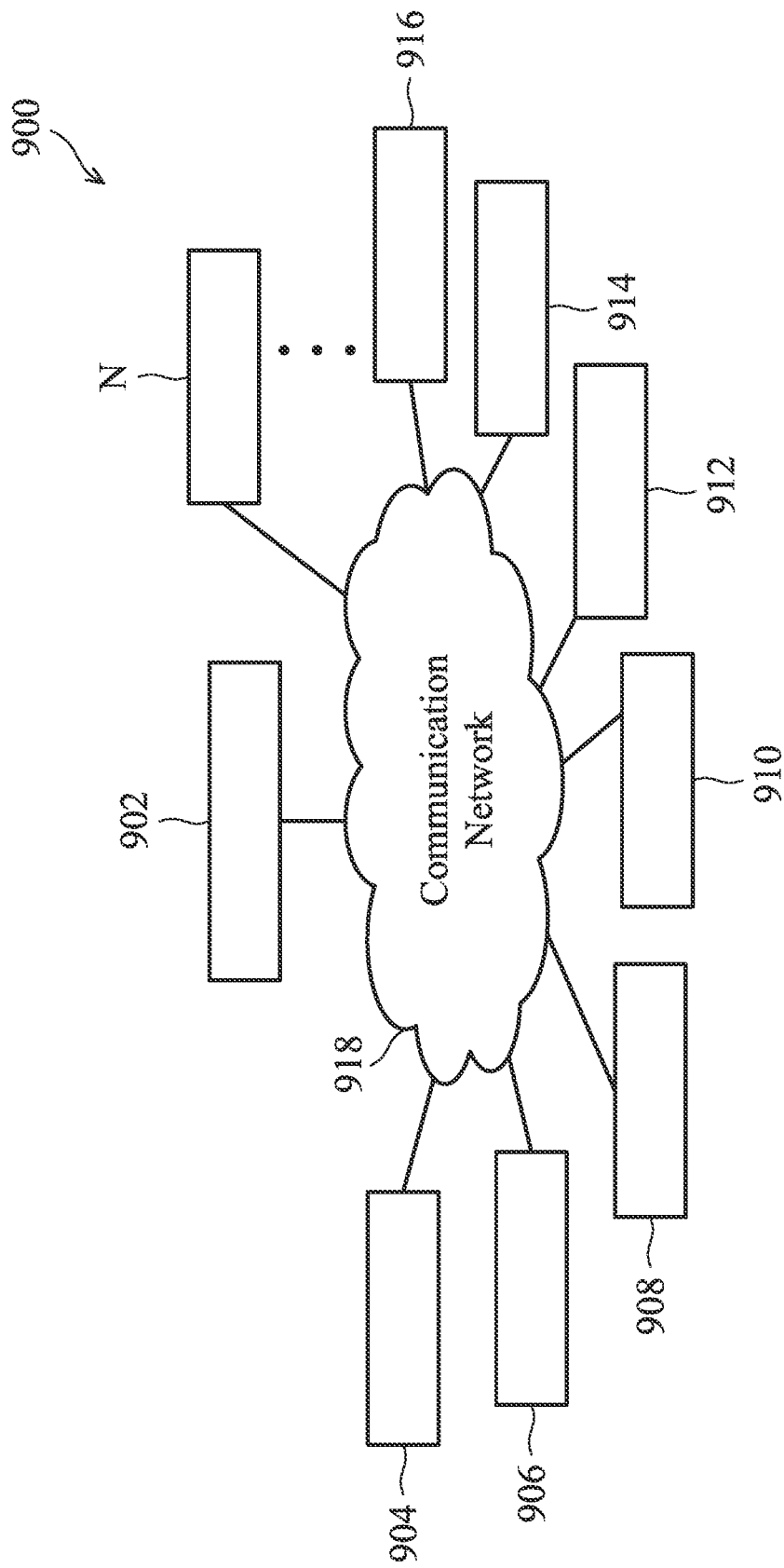
FIG. 15 is a block diagram of a manufacturing system according to various aspects of the present disclosure.

FIG. 15 illustrates an integrated circuit fabrication system 900 according to embodiments of the present disclosure. The fabrication system 900 includes a plurality of entities 902, 904, 906, 908, 910, 912, 914, 916 . . . , N that are connected by a communications network 918. The network 918 may be a single network or may be a variety of different networks, such as an intranet and the Internet, and may include both wire line and wireless communication channels.

In an embodiment, the entity 902 represents a service system for manufacturing collaboration; the entity 904 represents an user, such as product engineer monitoring the interested products; the entity 906 represents an engineer, such as a processing engineer to control process and the relevant recipes, or an equipment engineer to monitor or tune the conditions and setting of the processing tools; the entity 908 represents a metrology tool for IC testing and measurement; the entity 910 represents a semiconductor processing tool, such an EUV tool that is used to perform lithography processes to define the gate spacers of an SRAM device; the entity 912 represents a virtual metrology module associated with the processing tool 910; the entity 914 represents an advanced processing control module associated with the processing tool 910 and additionally other processing tools; and the entity 916 represents a sampling module associated with the processing tool 910.

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 914 may include a plurality of computer hardware having software instructions encoded therein. The computer hardware may include hard drives, flash drives, CD-ROMs, RAM memory, display devices (e.g., monitors), input/output device (e.g., mouse and keyboard). The software instructions may be written in any suitable programming language and may be designed to carry out specific tasks.

The integrated circuit fabrication system 900 enables interaction among the entities for the purpose of integrated circuit (IC) manufacturing, as well as the advanced processing control of the IC manufacturing. In an embodiment, the advanced processing control includes adjusting the processing conditions, settings, and/or recipes of one processing tool applicable to the relevant wafers according to the metrology results.

In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 900 may enable collaboration and information access in such areas as design, engineering, and processing, metrology, and advanced processing control. Another capability provided by the IC fabrication system 900 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

Figure 16:
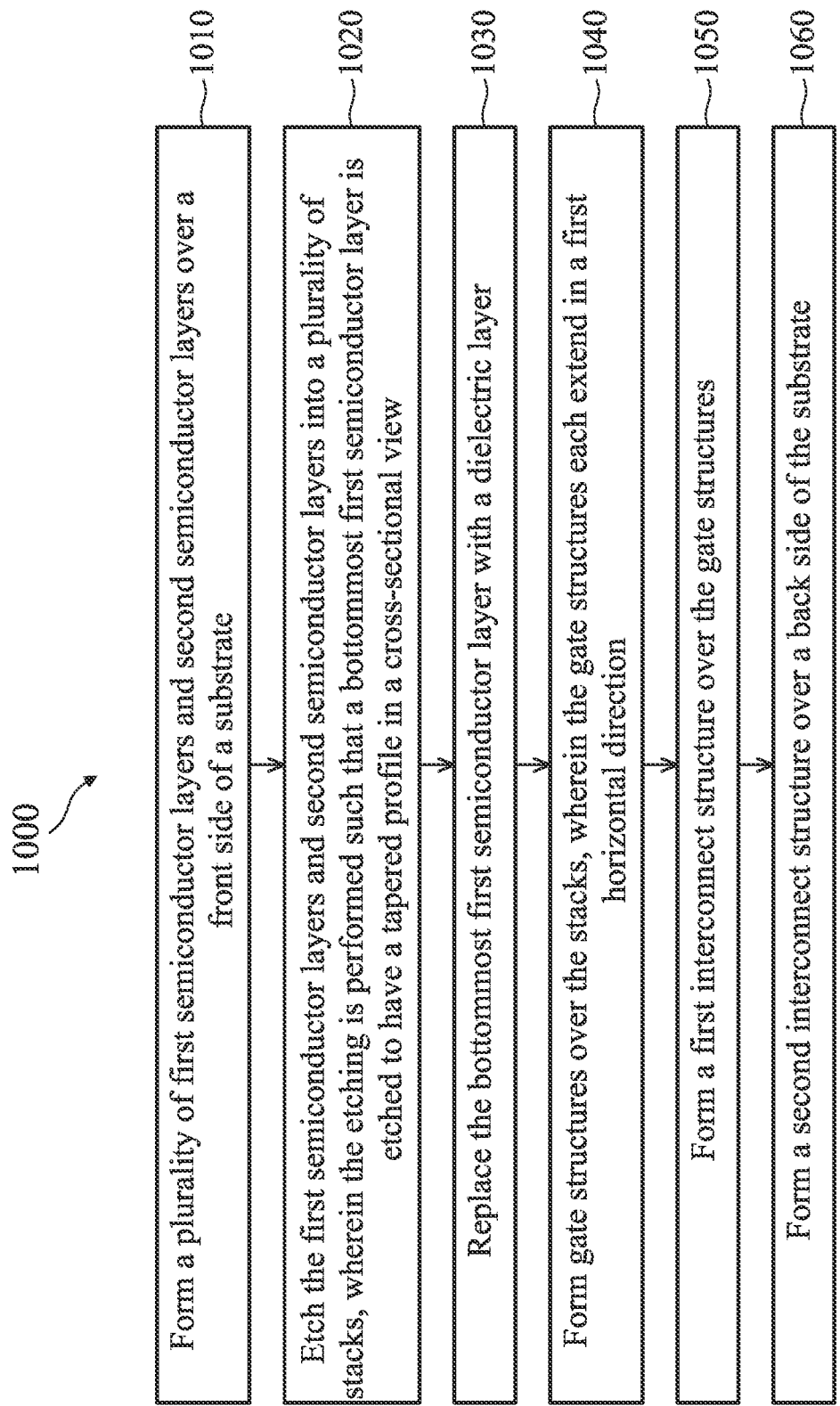
FIG. 16 is a flowchart illustrating a method of fabricating a semiconductor device according to various aspects of the present disclosure.

FIG. 16 is a flowchart illustrating a method 1000 of fabricating a semiconductor device according to embodiments of the present disclosure. The method 1000 includes a step 1010 to form a plurality of first semiconductor layers and second semiconductor layers over a front side of a substrate. The first semiconductor layers interleave with the second semiconductor layers in a vertical direction. In some embodiments, the step 1010 comprises epitaxially growing silicon germanium (SiGe) as the first semiconductor layers and epitaxially growing silicon as the second semiconductor layers.

The method 1000 includes a step 1020 to etch the first semiconductor layers and second semiconductor layers into a plurality of stacks. The etching is performed such that a bottommost first semiconductor layer is etched to have a tapered profile in a cross-sectional view. In some embodiments, the step 1020 comprises etching the bottommost first semiconductor layer such that the tapered profile is tapered in the first horizontal direction. In some embodiments, the step 1020 is performed at least in part using a fluorine-containing etchant, and wherein the etching comprises reducing the fluorine-containing etchant when the bottommost first semiconductor layer is etched.

The method 1000 includes a step 1030 to replace the bottommost first semiconductor layer with a dielectric layer. The dielectric layer inherits the tapered profile of the bottommost first semiconductor layer. In some embodiments, the step 1030 includes etching away the bottommost first semiconductor layer to form a recess and filling the recess with silicon carbon nitride (SiCN) as the dielectric layer.

The method 1000 includes a step 1040 to form gate structures over the stacks. The gate structures each extend in a first horizontal direction.

The method 1000 includes a step 1050 to form a first interconnect structure over the gate structures.

The method 1000 includes a step 1060 to form a second interconnect structure over a back side of the substrate.

It is understood that the method 1000 may include further steps performed before, during, or after the steps 1010-1060. For example, before the forming of the second interconnect structure, the method 1000 may include the steps of forming a carrier substrate over the first interconnect structure, thinning the substrate from the back side, and forming a plurality of vias that each extends from the back side toward the front side. The second interconnect structure is formed over the vias on the back side. In some embodiments, the substrate includes: a carrier, an insulator disposed on the carrier, and a semiconductor substrate disposed on the insulator. In some embodiments, the etching step 1020 comprises etching the semiconductor substrate into a plurality of semiconductor substrate segments. In some embodiments, the thinning comprises removing the carrier and the insulator from the back side until the semiconductor substrate segments are exposed from the back side. In some embodiments, the forming of the vias comprises: replacing the semiconductor substrate segments with dielectric isolation structures, etching via holes in the dielectric isolation structures from the back side, and forming the vias by filling the via holes with a conductive material. In some embodiments, the dielectric layer serves as an etching-stop layer during the etching of the via holes. In some embodiments, at least a portion of the dielectric layer separates the vias from the gate structures after the vias have been formed. The method 1000 may also include steps of forming dummy gate structures, replacing the dummy gate structures with high-k metal gate structures as the gate structures, packaging, testing, etc. For reasons of simplicity, these additional steps are not discussed herein in detail.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure. It is also understood that the various aspects of the present disclosure discussed above may apply to multi-channel devices such as Gate-All-Around (GAA) devices. To the extent that the present disclosure refers to a fin structure or FinFET devices, such discussions may apply equally to the GAA devices.

In summary, the present disclosure forms a dielectric layer having a tapered profile as an etching-stop layer during the etching of a source/drain via hole from a back side of the IC device. Such a tapered profile may be configured by etching a fin stack that includes a plurality of interleaving semiconductor layers with different material compositions (e.g., Si versus SiGe). The bottommost one of the semiconductor layers is etched differently from the rest of the semiconductor layers, for example by reducing a fluorine-containing etchant gas while the bottommost semiconductor layer is etched than when the rest of the semiconductor layers are etched. This causes the bottommost semiconductor layer to have a tapered profile. In a later process, the bottommost semiconductor layer is removed and replaced with the dielectric layer, so that the dielectric layer inherits the tapered profile of the bottommost semiconductor layer.

Forming such a dielectric layer with the tapered profile in the manner described in the present disclosure may offer advantages over conventional devices. However, it is understood that not all advantages are discussed herein, different embodiments may offer different advantages, and that no particular advantage is required for any embodiment. One advantage is that undesirable electrical shorting may be prevented. In more detail, as semiconductor feature sizes continue to shrink with each technology generation, interconnect structures may be formed in a back side (in addition to the front side) of the IC device to provide further electrical interconnection options. However, as source/drain via holes are etched from the back side, the etching may inadvertently expose portions of the metal-containing gate structure. When this occurs, the back side source/drain via formed to fill the via hole may come into direct physical contact with the metal-containing gate structure, which leads to undesirable electrical shorting. According to the various aspects of the present disclosure, the dielectric layer (serving as an etching-stop layer during the back side via hole etching) has a tapered cross-sectional profile, meaning that it extends out laterally farther than conventional dielectric layers. This allows it to stop the via hole from being etched in a manner that could expose the metal-containing gate structures. As such, the tapered dielectric layer herein can effectively prevent the undesirable electrical shorting between the metal-containing gate structure and the source/drain via formed from the back side of the IC device. Other advantages may include compatibility with existing fabrication processes (including for both FinFET and GAA processes) and the ease and low cost of implementation.

One aspect of the present disclosure involves a semiconductor device. The semiconductor device includes a stack of nano-structures that each contain a semiconductive material. The semiconductor device includes a gate structure that is disposed over the nano-structures on a first side. The semiconductor device includes a via disposed over the nano-structures on a second side that is opposite the first side. The semiconductor device includes a dielectric layer disposed between the nano-structures and the via, wherein the dielectric layer has a tapered profile in a cross-sectional view.

Another aspect of the present disclosure involves a semiconductor device. The semiconductor device includes a plurality of semiconductor channels stacked over one another vertically. The semiconductor device includes a gate structure formed over the semiconductor channels. Each of the semiconductor channels is circumferentially surrounded by the gate structure, and wherein the gate structure extends in a first lateral direction. The semiconductor device includes a first interconnect structure formed over the gate structure. The semiconductor device includes a dielectric layer located below a bottommost one of the semiconductor channels. A side surface of the dielectric layer is tapered in the first lateral direction. The semiconductor device includes a conductive via located below the dielectric layer. The dielectric layer prevents the conductive via from coming into direct physical contact with the gate structure. The semiconductor device includes a second interconnect structure located below the conductive via.

Yet another aspect of the present disclosure involves a method of fabricating a semiconductor device. A plurality of first semiconductor layers and second semiconductor layers are formed over a front side of a substrate. The first semiconductor layers interleave with the second semiconductor layers in a vertical direction. The first semiconductor layers and second semiconductor layers are etched into a plurality of stacks. The etching is performed such that a bottommost first semiconductor layer is etched to have a tapered profile in a cross-sectional view. The bottommost first semiconductor layer is replaced with a dielectric layer. The dielectric layer inherits the tapered profile of the bottommost first semiconductor layer. Gate structures are formed over the stacks. The gate structures each extend in a first horizontal direction. A first interconnect structure is formed over the gate structures. A second interconnect structure is formed over a back side of the substrate.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a stack of nano-structures that each contain a semiconductive material;
    a gate structure disposed over the nano-structures on a first side;
    a via disposed over the nano-structures on a second side that is opposite the first side; and
    a dielectric layer disposed between the nano-structures and the via, wherein the dielectric layer has a tapered profile in a cross-sectional view.

2. The semiconductor device of claim 1, wherein the nano-structures are channels of a gate-all-around (GAA) transistor, and wherein portions of the gate structure circumferentially surround the nano-structures.

3. The semiconductor device of claim 2, wherein the GAA transistor further comprises a source/drain, and wherein the via is electrically coupled to the source/drain.

4. The semiconductor device of claim 1, wherein a tapered portion of the dielectric layer prevents the via from coming into direct physical contact with the gate structure.

5. The semiconductor device of claim 1, wherein according to the tapered profile, a first surface of the dielectric layer facing the via is wider than a second surface of the dielectric layer facing the gate structure.

6. The semiconductor device of claim 1, further comprising:
    a first interconnect structure disposed over the gate structure on the first side; and
    a second interconnect structure disposed over the via on the second side.

7. The semiconductor device of claim 1, wherein:
    the gate structure extends in a first horizontal direction; and
    the dielectric layer is tapered in the first horizontal direction.

8. A semiconductor device, comprising:
    a plurality of semiconductor channels stacked over one another vertically;
    a gate structure formed over the semiconductor channels, wherein each of the semiconductor channels is circumferentially surrounded by the gate structure, and wherein the gate structure extends in a first lateral direction;
    a first interconnect structure formed over the gate structure;
    a dielectric layer located below a bottommost one of the semiconductor channels, wherein a side surface of the dielectric layer is tapered in the first lateral direction;
    a conductive via located below the dielectric layer, wherein the dielectric layer prevents the conductive via from coming into direct physical contact with the gate structure; and
    a second interconnect structure located below the conductive via.

9. The semiconductor device of claim 8, wherein:
    the dielectric layer has a first planar surface facing the gate structure and a second planar surface facing the conductive via; and
    the second planar surface is longer than the first planar surface in the first lateral direction.

10. The semiconductor device of claim 9, wherein the second planar surface is longer than each of the semiconductor channels in the first lateral direction.

11. The semiconductor device of claim 8, wherein the semiconductor channels include nano-structures of a gate-all-around (GAA) transistor.

12. The semiconductor device of claim 11, wherein the GAA transistor further comprises a source/drain, and wherein the conductive via is electrically coupled to the source/drain.

13. The semiconductor device of claim 8, wherein a first planar surface and a second planar surface of the dielectric layer have unequal lengths in a cross-sectional side view.

14. The semiconductor device of claim 8, wherein:
    a first subset of the semiconductor channels contains silicon; and
    a second subset of the semiconductor channels contains silicon germanium.

15. The semiconductor device of claim 8, wherein at least a portion of a surface of the gate structure is tapered.

16. The semiconductor device of claim 8, wherein the dielectric layer is an etching-stop layer and contains silicon carbon nitride.

17. A semiconductor device, comprising:
    a plurality of nano-structure channels, wherein a first subset of the nano-structure channels each contain a first semiconductive material, and wherein a second subset of the nano-structure channels each contain a second semiconductive material;
    a gate structure, wherein at least some of the nano-structure channels are circumferentially surrounded by the gate structure in a cross-sectional side view;
    a dielectric layer located over the gate structure; and
    a conductive via located over the dielectric layer, wherein the conductive via is separated from the gate structure at least in part by the dielectric layer.

18. The semiconductor device of claim 17, wherein the dielectric layer and the gate structure form an interface, and wherein at least a segment of the interface is slanted in the cross-sectional side view.

19. The semiconductor device of claim 17, further comprising an interlayer dielectric (ILD) that laterally surrounds the conductive via, wherein a portion of the ILD is in direct physical contact with the dielectric layer.

20. The semiconductor device of claim 17, further comprising a source/drain, wherein the conductive via is electrically coupled to the source/drain.

\* \* \* \* \*